(12) United States Patent
Kim et al.

(10) Patent No.: US 7,050,410 B1
(45) Date of Patent: May 23, 2006

(54) APPARATUS AND METHOD FOR CONTROLLING A DEMULTIPLEXER AND A MULTIPLEXER USED FOR RATE MATCHING IN A MOBILE COMMUNICATION SYSTEM

(75) Inventors: Se-Hyoung Kim, Seoul (KR); Min-Goo Kim, Suwon-shi (KR); Beong-Jo Kim, Songnam-shi (KR); Soon-Jae Choi, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 620 days.

(21) Appl. No.: 09/613,068

(22) Filed: Jul. 10, 2000

(30) Foreign Application Priority Data

| Jul. 8, 1999 | (KR) | ............................... 1999-27407 |
| Jul. 23, 1999 | (KR) | ............................... 1999-30095 |
| Aug. 30, 1999 | (KR) | ............................... 1999-37496 |

(51) Int. Cl.
 *H04B 7/216* (2006.01)
 *H03M 13/03* (2006.01)
(52) U.S. Cl. ...................... 370/335; 370/342; 370/535; 375/240.27; 714/786; 714/790
(58) Field of Classification Search ................ 370/328, 370/536, 537, 542; 714/786, 790
 See application file for complete search history.

(56) References Cited

U.S. PATENT DOCUMENTS

| 5,771,229 A | * | 6/1998 | Gavrilovich ................. 370/342 |
| 5,881,109 A | * | 3/1999 | Kim et al. ................... 375/298 |
| 5,978,365 A | * | 11/1999 | Yi ............................... 370/331 |
| 6,061,820 A | * | 5/2000 | Nakakita et al. ............ 714/751 |
| 6,088,387 A | * | 7/2000 | Gelblum et al. ............ 375/222 |
| 6,304,991 B1 | * | 10/2001 | Rowitch et al. ............ 714/755 |
| 6,400,703 B1 | * | 6/2002 | Park et al. ................... 370/342 |
| 6,553,539 B1 | * | 4/2003 | Markarian et al. .......... 714/790 |
| 6,615,387 B1 | * | 9/2003 | Williamson et al. ........ 714/785 |

OTHER PUBLICATIONS

Japanese Office Action dated Dec. 9, 2003 issued in a counterpart application, namely, Appln. No. 2001-509176.
Nortel Networks: "Proposal for Rate Matching for Turbo Codes", 1999.
3rd Generation Partnership Project (3GPP), "Multiplexing and Channel Coding (FDD)", 1999.
Samsung Electronics Co., "Unified Rate Matching Scheme for Turbo/Convolutional Codes and Up/Down Links", 1999.

(Continued)

*Primary Examiner*—Chau Nguyen
*Assistant Examiner*—Soon D. Hyun
(74) *Attorney, Agent, or Firm*—Dilworth & Barrese LLP

(57) ABSTRACT

A transmitting device including an encoder for receiving an information bit stream in a frame and outputting an information symbol, a first parity symbol, and a second parity symbol by encoding each information bit. An interleaver sequentially arranges the information symbols and the first and second parity symbols by rows in an array with an integer number of rows and an integer number of columns. The interleaver further outputs a plurality of radio frames in a stream, by reading the symbols by going down each column, starting at the leftmost column and proceeding right. Each radio frame has a predetermined size. A demultiplexer demultiplexes the radio frames received from the interleaver into streams of information, first parity symbols, and second parity symbols. A rate matcher bypasses the stream of information symbols and punctures the streams of the first and second parity symbols for rate matching.

57 Claims, 24 Drawing Sheets

OTHER PUBLICATIONS

Samsung Electronics Co., "A Method to Classify the Interleaved Symbols of $1^{st}$ MIL Interleaver Using Some Property", 1999.

Fujitsu & Siemens, "Universal Rate Matching Method for Up/Downlink and Turbo/Convolutional Coding", 1999.

Nortel Networks, Optimum Rate Matching of Turbo/Convolutional Coding for 3 GPP Up/Down Links, 1999.

Nortel Networks, Analysis of Commonalities of Turbo Code Puncturing Rate Matching Proposals, 1999.

* cited by examiner

1st INTERLEAVER INPUT (CODE RATE R=1/3)

| 1 | 2 | 3 | 4 | 5 | 6 | 7 | 8 |
|---|---|---|---|---|---|---|---|
| 9 | 10 | 11 | 12 | 13 | 14 | 15 | 16 |
| 17 | 18 | 19 | 20 | 21 | 22 | 23 | 24 |
| 25 | 26 | 27 | 28 | 29 | 30 | 31 | 32 |
| 33 | 34 | 35 | 36 | 37 | 38 | 39 | 40 |
| 41 | 42 | 43 | 44 | 45 | 46 | 47 | 48 |
| 49 | 50 | 51 | 52 | 53 | 54 | 55 | 56 |
| 57 | 58 | 59 | 60 | 61 | 62 | 63 | 64 |
| 65 | 66 | 67 | 68 | 69 | 70 | 71 | 72 |
| 73 | 74 | 75 | 76 | 77 | 78 | 79 | 80 |
| 81 | 82 | 83 | 84 | 85 | 86 | 87 | 88 |
| 89 | 90 | 91 | 92 | 93 | 94 | 95 | 96 |
| 97 | 98 | 99 | 100 | 101 | 102 | 103 | 104 |
| 105 | 106 | 107 | 108 | 109 | 110 | 111 | 112 |
| 113 | 114 | 115 | 116 | 117 | 118 | 119 | 120 |
| 121 | 122 | 123 | 124 | 125 | 126 | 127 | 128 |
| 129 | 130 | 131 | 132 | 133 | 134 | 135 | 136 |
| 137 | 138 | 139 | 140 | 141 | 142 | 143 | 144 |
| 145 | 146 | 147 | 148 | 149 | 150 | 151 | 152 |
| 153 | 154 | 155 | 156 | 157 | 158 | 159 | 160 |

FIG. 4

1ST INTERLEAVER OUTPUT WHEN TTI=20msec (CODE RATE=1/3)

| 1 | 3 | 5 | 7 | 9 | 11 | 13 | 15 |
|---|---|---|---|---|---|---|---|
| 17 | 19 | 21 | 23 | 25 | 27 | 29 | 31 |
| 33 | 35 | 37 | 39 | 41 | 43 | 45 | 47 |
| 49 | 51 | 53 | 55 | 57 | 59 | 61 | 63 |
| 65 | 67 | 69 | 71 | 73 | 75 | 77 | 79 |
| 81 | 83 | 85 | 87 | 89 | 91 | 93 | 95 |
| 97 | 99 | 101 | 103 | 105 | 107 | 109 | 111 |
| 113 | 115 | 117 | 119 | 121 | 123 | 125 | 127 |
| 129 | 131 | 133 | 135 | 137 | 139 | 141 | 143 |
| 145 | 147 | 149 | 151 | 153 | 155 | 157 | 159 |
| 2 | 4 | 6 | 8 | 10 | 12 | 14 | 16 |
| 18 | 20 | 22 | 24 | 26 | 28 | 30 | 32 |
| 34 | 36 | 38 | 40 | 42 | 44 | 46 | 48 |
| 50 | 52 | 54 | 56 | 58 | 60 | 62 | 64 |
| 66 | 68 | 70 | 72 | 74 | 76 | 78 | 80 |
| 82 | 84 | 86 | 88 | 90 | 92 | 94 | 96 |
| 98 | 100 | 102 | 104 | 106 | 108 | 110 | 112 |
| 114 | 116 | 118 | 120 | 122 | 124 | 126 | 128 |
| 130 | 132 | 134 | 136 | 138 | 140 | 142 | 144 |
| 146 | 148 | 150 | 152 | 154 | 156 | 158 | 160 |

FIG. 5A

1ST INTERLEAVER OUTPUT WHEN TTI=40msec (CODE RATE=1/3)

| 1 | 5 | 9 | 13 | 17 | 21 | 25 | 29 |
|---|---|---|---|---|---|---|---|
| 33 | 37 | 41 | 45 | 49 | 53 | 57 | 61 |
| 65 | 69 | 73 | 77 | 81 | 85 | 89 | 93 |
| 97 | 101 | 105 | 109 | 113 | 117 | 121 | 125 |
| 129 | 133 | 137 | 141 | 145 | 149 | 153 | 157 |
| 3 | 7 | 11 | 15 | 19 | 23 | 27 | 31 |
| 35 | 39 | 43 | 47 | 51 | 55 | 59 | 63 |
| 67 | 71 | 75 | 79 | 83 | 87 | 91 | 95 |
| 99 | 103 | 107 | 111 | 115 | 119 | 123 | 127 |
| 131 | 135 | 139 | 143 | 147 | 151 | 155 | 159 |
| 2 | 6 | 10 | 14 | 18 | 22 | 26 | 30 |
| 34 | 38 | 42 | 46 | 50 | 54 | 58 | 62 |
| 66 | 70 | 74 | 78 | 82 | 86 | 90 | 94 |
| 98 | 102 | 106 | 110 | 114 | 118 | 122 | 126 |
| 130 | 134 | 138 | 142 | 146 | 150 | 154 | 158 |
| 4 | 8 | 12 | 16 | 20 | 24 | 28 | 32 |
| 36 | 40 | 44 | 48 | 52 | 56 | 60 | 64 |
| 68 | 72 | 76 | 80 | 84 | 88 | 92 | 96 |
| 100 | 104 | 108 | 112 | 116 | 120 | 124 | 128 |
| 132 | 136 | 140 | 144 | 148 | 152 | 156 | 160 |

FIG. 5B

1ST INTERLEAVER OUTPUT WHEN TTI=80mSEC(CODE RATE=1/3)

| 1 | 9 | 17 | 25 | 33 | 41 | 49 | 57 |
|---|---|---|---|---|---|---|---|
| 65 | 73 | 81 | 89 | 97 | 105 | 113 | 121 |
| 129 | 137 | 145 | 153 | 5 | 13 | 21 | 29 |
| 37 | 45 | 53 | 61 | 69 | 77 | 85 | 93 |
| 101 | 109 | 117 | 125 | 133 | 141 | 149 | 157 |
| 3 | 11 | 19 | 27 | 35 | 43 | 51 | 59 |
| 67 | 75 | 83 | 91 | 99 | 107 | 115 | 123 |
| 131 | 139 | 147 | 155 | 7 | 15 | 23 | 31 |
| 39 | 47 | 55 | 63 | 71 | 79 | 87 | 95 |
| 103 | 111 | 119 | 127 | 135 | 143 | 151 | 159 |
| 2 | 10 | 18 | 26 | 34 | 42 | 50 | 58 |
| 66 | 74 | 82 | 90 | 98 | 106 | 114 | 122 |
| 130 | 138 | 146 | 154 | 6 | 14 | 22 | 30 |
| 38 | 46 | 54 | 62 | 70 | 78 | 86 | 94 |
| 102 | 110 | 118 | 126 | 134 | 142 | 150 | 158 |
| 4 | 12 | 20 | 28 | 36 | 44 | 52 | 60 |
| 68 | 76 | 84 | 92 | 100 | 108 | 116 | 124 |
| 132 | 140 | 148 | 156 | 8 | 16 | 24 | 32 |
| 40 | 48 | 56 | 64 | 72 | 80 | 88 | 96 |
| 104 | 112 | 120 | 128 | 136 | 144 | 152 | 160 |

FIG. 5C

| 1 | 2 | 3 | 4 | 5 | 6 | 7 | 8 |
|---|---|---|---|---|---|---|---|
| 9 | 10 | 11 | 12 | 13 | 14 | 15 | 16 |
| 17 | 18 | 19 | 20 | 21 | 22 | 23 | 24 |
| 25 | 26 | 27 | 28 | 29 | 30 | 31 | 32 |
| 33 | 34 | 35 | 36 | 37 | 38 | 39 | 40 |
| 41 | 42 | 43 | 44 | 45 | 46 | 47 | 48 |
| 49 | 50 | 51 | 52 | 53 | 54 | 55 | 56 |
| 57 | 58 | 59 | 60 | 61 | 62 | 63 | 64 |
| 65 | 66 | 67 | 68 | 69 | 70 | 71 | 72 |
| 73 | 74 | 75 | 76 | 77 | 78 | 79 | 80 |
| 81 | 82 | 83 | 84 | 85 | 86 | 87 | 88 |
| 89 | 90 | 91 | 92 | 93 | 94 | 95 | 96 |
| 97 | 98 | 99 | 100 | 101 | 102 | 103 | 104 |
| 105 | 106 | 107 | 108 | 109 | 110 | 111 | 112 |
| 113 | 114 | 115 | 116 | 117 | 118 | 119 | 120 |
| 121 | 122 | 123 | 124 | 125 | 126 | 127 | 128 |
| 129 | 130 | 131 | 132 | 133 | 134 | 135 | 136 |
| 137 | 138 | 139 | 140 | 141 | 142 | 143 | 144 |
| 145 | 146 | 147 | 148 | 149 | 150 | 151 | 152 |
| 153 | 154 | 155 | 156 | 157 | 158 | 159 | 160 |

FIG. 6

1ST INTERLEAVER OUTPUT WHEN TTI=20msec (CODE RATE R=1/2)

| 1 | 3 | 5 | 7 | 9 | 11 | 13 | 15 |
|---|---|---|---|---|---|---|---|
| 17 | 19 | 21 | 23 | 25 | 27 | 29 | 31 |
| 33 | 35 | 37 | 39 | 41 | 43 | 45 | 47 |
| 49 | 51 | 53 | 55 | 57 | 59 | 61 | 63 |
| 65 | 67 | 69 | 71 | 73 | 75 | 77 | 79 |
| 81 | 83 | 85 | 87 | 89 | 91 | 93 | 95 |
| 97 | 99 | 101 | 103 | 105 | 107 | 109 | 111 |
| 113 | 115 | 117 | 119 | 121 | 123 | 125 | 127 |
| 129 | 131 | 133 | 135 | 137 | 139 | 141 | 143 |
| 145 | 147 | 149 | 151 | 153 | 155 | 157 | 159 |
| 2 | 4 | 6 | 8 | 10 | 12 | 14 | 16 |
| 18 | 20 | 22 | 24 | 26 | 28 | 30 | 32 |
| 34 | 36 | 38 | 40 | 42 | 44 | 46 | 48 |
| 50 | 52 | 54 | 56 | 58 | 60 | 62 | 64 |
| 66 | 68 | 70 | 72 | 74 | 76 | 78 | 80 |
| 82 | 84 | 86 | 88 | 90 | 92 | 94 | 96 |
| 98 | 100 | 102 | 104 | 106 | 108 | 110 | 112 |
| 114 | 116 | 118 | 120 | 122 | 124 | 126 | 128 |
| 130 | 132 | 134 | 136 | 138 | 140 | 142 | 144 |
| 146 | 148 | 150 | 152 | 154 | 156 | 158 | 160 |

FIG. 7A

1ST INTERLEAVER OUTPUT WHEN TTI=40msec (CODE RATE R=1/2)

| 1 | 5 | 9 | 13 | 17 | 21 | 25 | 29 |
|---|---|---|----|----|----|----|----|
| 33 | 37 | 41 | 45 | 49 | 53 | 57 | 61 |
| 65 | 69 | 73 | 77 | 81 | 85 | 89 | 93 |
| 97 | 101 | 105 | 109 | 113 | 117 | 121 | 125 |
| 129 | 133 | 137 | 141 | 145 | 149 | 153 | 157 |
| 3 | 7 | 11 | 15 | 19 | 23 | 27 | 31 |
| 35 | 39 | 43 | 47 | 51 | 55 | 59 | 63 |
| 67 | 71 | 75 | 79 | 83 | 87 | 91 | 95 |
| 99 | 103 | 107 | 111 | 115 | 119 | 123 | 127 |
| 131 | 135 | 139 | 143 | 147 | 151 | 155 | 159 |
| 2 | 6 | 10 | 14 | 18 | 22 | 26 | 30 |
| 34 | 38 | 42 | 46 | 50 | 54 | 58 | 62 |
| 66 | 70 | 74 | 78 | 82 | 86 | 90 | 94 |
| 98 | 102 | 106 | 110 | 114 | 118 | 122 | 126 |
| 130 | 134 | 138 | 142 | 146 | 150 | 154 | 158 |
| 4 | 8 | 12 | 16 | 20 | 24 | 28 | 32 |
| 36 | 40 | 44 | 48 | 52 | 56 | 60 | 64 |
| 68 | 72 | 76 | 80 | 84 | 88 | 92 | 96 |
| 100 | 104 | 108 | 112 | 116 | 120 | 124 | 128 |
| 132 | 136 | 140 | 144 | 148 | 152 | 156 | 160 |

FIG. 7B

1ST INTERLEAVER OUTPUT WHEN TTI=80msec (CODE RATE R=1/2)

| 1 | 9 | 17 | 25 | 33 | 41 | 49 | 57 |
|---|---|---|---|---|---|---|---|
| 65 | 73 | 81 | 89 | 97 | 105 | 113 | 121 |
| 129 | 137 | 145 | 153 | 5 | 13 | 21 | 29 |
| 37 | 45 | 53 | 61 | 69 | 77 | 85 | 93 |
| 101 | 109 | 117 | 125 | 133 | 141 | 149 | 157 |
| 3 | 11 | 19 | 27 | 35 | 43 | 51 | 59 |
| 67 | 75 | 83 | 91 | 99 | 107 | 115 | 123 |
| 131 | 139 | 147 | 155 | 7 | 15 | 23 | 31 |
| 39 | 47 | 55 | 63 | 71 | 79 | 87 | 95 |
| 103 | 111 | 119 | 127 | 135 | 143 | 151 | 159 |
| 2 | 10 | 18 | 26 | 34 | 42 | 50 | 58 |
| 66 | 74 | 82 | 90 | 98 | 106 | 114 | 122 |
| 130 | 138 | 146 | 154 | 6 | 14 | 22 | 30 |
| 38 | 46 | 54 | 62 | 70 | 78 | 86 | 94 |
| 102 | 110 | 118 | 126 | 134 | 142 | 150 | 158 |
| 4 | 12 | 20 | 28 | 36 | 44 | 52 | 60 |
| 68 | 76 | 84 | 92 | 100 | 108 | 116 | 124 |
| 132 | 140 | 148 | 156 | 8 | 16 | 24 | 32 |
| 40 | 48 | 56 | 64 | 72 | 80 | 88 | 96 |
| 104 | 112 | 120 | 128 | 136 | 144 | 152 | 160 |

FIG. 7C

TTI = 10msec    RF

TTI = 20msec    RF1   RF2

TTI = 40msec

| RF1 | RF2 | RF3 | RF4 |
|---|---|---|---|
| x | z | y | x |
| y | x | z | y |
| z | y | x | z |
| x | z | y | x |
| y | x | z | y |
| z | y | x | z |
| ⋮ | ⋮ | ⋮ | ⋮ |

FIG. 8C

TTI = 80msec

| RF1 | RF2 | RF3 | RF4 | RF5 | RF6 | RF7 | RF8 |
|---|---|---|---|---|---|---|---|
| x | y | z | x | y | z | x | y |
| z | x | y | z | x | y | z | x |
| y | z | x | y | z | x | y | z |
| x | y | z | x | y | z | x | y |
| z | x | y | z | x | y | z | x |
| y | z | x | y | z | x | y | z |
| ⋮ | ⋮ | ⋮ | ⋮ | ⋮ | ⋮ | ⋮ | ⋮ |

FIG. 8D

1ST INTERLEAVER INPUT WHEN TTI = 80msec

| x | y | z | x | y | z | x | y |
|---|---|---|---|---|---|---|---|
| z | x | y | z | x | y | z | x |
| y | z | x | y | z | x | y | z |
| x | y | z | x | y | z | x | y |
| z | x | y | z |   |   |   |   |

FIG. 9A

1ST INTERLEAVER OUTPUT

| x | y | z | x | y | z | x | y |
|---|---|---|---|---|---|---|---|
| z | x | y | z | x | y | z | x |
| y | z | x | y | z | x | y | z |
| x | y | z | x | y | z | x | y |
| z |   | y |   | x |   | z |   |

FIG. 9B

RADIO FRAME SEGMENTER OUTPUT (WITH FILLER BITS INSERTED)

| RF1 | RF2 | RF3 | RF4 | RF5 | RF6 | RF7 | RF8 |
|-----|-----|-----|-----|-----|-----|-----|-----|
| x   | y   | y   | z   | z   | y   | z   | y   |
| z   | x   | x   | y   | y   | x   | y   | x   |
| y   | z   | z   | x   | x   | z   | x   | z   |
| x   | y   | y   | y   | z   | x   | z   | y   |
| z   | z   | x   | x   | 0   | 0   | 0   | 0   |

FIG. 9C

1ST INTERLEAVER INPUT WHEN TTI = 40msec

| x | y | z | x |
|---|---|---|---|
| y | z | x | y |
| z | x | y | z |
| x | y | z | x |
| y | z | x | y |
| z |   |   |   |

FIG. 10A

1ST INTERLEAVER OUTPUT

| x | z | y | x |
|---|---|---|---|
| y | x | z | y |
| z | y | x | z |
| x | z | y | x |
| y | x | z | y |
| z |   |   |   |

FIG. 10B

RADIO FREAME SEGMENTER OUTPUT (WITH FILLER BITS INSERTED)

| RF1 | RF2 | RF3 | RF4 |
|-----|-----|-----|-----|
| x   | z   | y   | x   |
| y   | x   | z   | y   |
| z   | y   | x   | z   |
| x   | z   | y   | x   |
| y   | x   | z   | y   |
| z   | 0   | 0   | 0   |

FIG. 10C

1ST INTERLEAVER INPUT WHEN TTI = 80msec

| x | y | z | x | y | z | x | y |
|---|---|---|---|---|---|---|---|
| z | x | y | z | x | y | z | x |
| y | z | x | y | z | x | y | z |
| x | y | z | x | y | z | x | y |
| z | x | y | z |   |   |   |   |

FIG. 11A

1ST INTERLEAVER OUTPUT

| x | y | z | x | y | z | x | y |
|---|---|---|---|---|---|---|---|
| z | x | y | z | x | y | z | x |
| y | z | x | y | z | x | y | z |
| x | y | z | x | y | z | x | y |
| z |   | y |   | x |   | z |   |

FIG. 11B

FIRST INTERLEAVER OUTPUT (WITH FILLER BITS INSERTED)

| x | y | z | x | y | z | x | y |
|---|---|---|---|---|---|---|---|
| z | x | y | z | x | y | z | x |
| y | z | x | y | z | x | y | z |
| x | y | z | x | y | z | x | y |
| z | 0 | y | 0 | x | 0 | z | 0 |

FIG. 11C

RADIO FRAME SEGMENTER OUTPUT

| x | y | z | x | y | z | x | y |
|---|---|---|---|---|---|---|---|
| z | x | y | z | x | y | z | x |
| y | z | x | y | z | x | y | z |
| x | y | z | x | y | z | x | y |
| z | 0 | y | 0 | x | 0 | z | 0 |

FIG. 11D

1ST INTERLEAVER INPUT WHEN TTI = 80msec

| x | y | z | x | y | z | x | y |
|---|---|---|---|---|---|---|---|
| z | x | y | z | x | y | z | x |
| y | z | x | y | z | x | y | z |
| x | y | z | x | y | z | x | y |
| z | x | y | z |   |   |   |   |

FIG. 12A

1ST INTERLEAVER OUTPUT

| x | y | z | x | y | z | x | y |
|---|---|---|---|---|---|---|---|
| z | x | y | z | x | y | z | x |
| y | z | x | y | z | x | y | z |
| x | y | z | x | y | z | x | y |
| z |   | y |   | x |   | z |   |

FIG. 12B

RADIO FRAME SEGMENTER OUTPUT

| RF1 | RF2 | RF3 | RF4 | RF5 | RF6 | RF7 | RF8 |
|-----|-----|-----|-----|-----|-----|-----|-----|
| x   | y   | z   | x   | y   | z   | x   | y   |
| z   | x   | y   | z   | x   | y   | z   | x   |
| y   | z   | x   | y   | z   | x   | y   | z   |
| x   | y   | z   | x   | y   | z   | x   | y   |
| z   | 0   | y   | 0   | x   | 0   | z   | 0   |

FIG. 12C

APPARATUS AND METHOD FOR CONTROLLING A DEMULTIPLEXER AND A MULTIPLEXER USED FOR RATE MATCHING IN A MOBILE COMMUNICATION SYSTEM

PRIORITY

This application claims priority to applications entitled "Apparatus and Method for Controlling Demultiplexer and Multiplexer for Rate Matching in Mobile Communication System" filed in the Korean Industrial Property Office on Jul. 8, 1999 and assigned Ser. No. 99-27407, "Apparatus and Method for Controlling Demultiplexer and Multiplexer for Rate Matching in Mobile Communication System" filed in the Korean Industrial Property Office on Jul. 23, 1999 and assigned Ser. No. 99-30095, and "Apparatus and Method for Controlling Demultiplexer and Multiplexer for Rate Matching in Mobile Communication System" filed in the Korean Industrial Property Office on Aug. 30, 1999 and assigned Ser. No. 99-37496, the contents of all of which are hereby incorporated by reference.

BACKGROUND OF THE INVENTION

1. Field of the Invention

The present invention relates generally to the rate matching of a channel encoded signal, and in particular, to an apparatus and method for controlling a demultiplexer (DE-MUX) and a multiplexer (MUX) used for rate matching.

2. Description of the Related Art

In general, radio communication systems, such as satellite, ISDN (Integrated Services Digital Network), W-CDMA (Wide band-Code Division Multiple Access), UMTS (Universal Mobile Telecommunication System), and IMT (International Mobile Telecommunication)-2000 systems, channel-encode source user data with an error correction code prior to transmission, in order to increase system reliability. Typical codes used for channel encoding are convolutional codes and linear blocks code for which a single decoder is used. Lately, turbo codes, which are useful for data transmission and reception, have been suggested.

A multiple-access and multiple-channel communication system matches the number of channel encoded symbols to a given number of transmission data symbols to increase data transmission efficiency and system performance. This operation is called rate matching. Puncturing and repetition are widely performed to match the data rate of channel encoded symbols. Rate matching has recently emerged as a significant factor in UMTS for increasing data transmission efficiency in the air interface and for improving system performance.

FIG. 1 is a block diagram of an uplink transmitting device in a general mobile communication system (a UMTS system, herein).

Referring to FIG. 1, a channel encoder 110 receives frame data at predetermined TTIs (Transmission Time Intervals) which may be 10, 20, 40, or 80 ms, and encodes the received frame data. And the channel encoder 110 outputs encoded symbols according to a predetermined coding rate R. The frame data size (number of information bits) is determined by a (data rate of the frame data)*(TTI). If tail bits are not considered, the number of encoded symbols are determined by the (frame data size)*(coding rate R). A $1^{st}$ interleaver 120 interleaves the output of the channel encoder 110. A radio frame segmenter 130 segments interleaved symbols received from the $1^{st}$ interleaver 120 into 10-ms radio frame blocks of which size is determined by (the number of encoded symbols)/(10), wherein 10 is the radio frame length unit. A rate matcher 140 matches the data rate of a radio frame received from the radio frame segmenter 130 to a preset data rate by puncturing or repeating symbols of the radio frame. The above-described components can be provided for each service.

A MUX 150 multiplexes rate-matched radio frames from each service. A physical channel segmenter 160 segments the multiplexed radio frames received from the MUX 150 into physical channel blocks. A $2^{nd}$ interleaver 170 interleaves the physical channel blocks received from the physical channel segmenter 160. A physical channel mapper 180 maps the $2^{nd}$-interleaved blocks on physical channels for transmission.

As shown in FIG. 1, the UMTS uplink transmitting device is provided with rate matchers 140. The rate matcher 140 varies in configuration depending on whether the channel encoder 110 is a convolutional encoder or a turbo encoder.

When a linear block code is used (a convolutional encoder and a single decoder are used in this case) for the channel encoder, the following requirements of rate matching should be satisfied to increase data transmission efficiency and system performance in a multiple-access/multiple-channel scheme.

1. An input symbol sequence is punctured/repeated in a predetermined periodic pattern.
2. The number of punctured symbols is minimized whereas the number of repeated symbols is maximized.
3. A uniform puncturing/repeating pattern is used to puncture/repeat encoded symbols uniformly.

The above requirements are set on the assumption that the error sensitivity of a code symbol at any position in one frame output from a convolutional encoder is similar. Although some favorable results can be produced using the above requirements, a rate matching scheme different from the convolutional encoder should be employed when using a turbo encoder because of the different error sensitivities of symbols at different positions in one frame.

When a turbo encoder is used, it is preferred that the systematic information part of the encoded symbols is not punctured since the turbo encoder is a systematic encoder. Due to the two component encoder structure of the turbo encoder, the minimum free distance of the output code is maximized when the minimum free distance of each of the two component codes is maximized. To do so, the output symbols of the two component encoders should be punctured equally to thereby achieve optimal performance.

As described above, a distinction should be made between the information symbols and the parity symbols in the encoded symbols when a turbo encoder is used, to achieve optimal rate matching. Processing, such as channel interleaving, can be interposed between the turbo encoder and a rate matcher. Nevertheless, the distinction between information symbols and parity symbols should be preserved. However, this is impossible because all of the channel encoded symbols are randomly mixed after channel interleaving.

SUMMARY OF THE INVENTION

An object of the present invention is to provide an apparatus and method for performing rate matching separately on information symbols and parity symbols during symbol encoding in an uplink transmitting device of a mobile communication system.

Another object of the present invention is to provide an apparatus and method for disposing a DEMUX before a rate matcher in order to separate symbol data into information symbols and parity symbols in a mobile communication system.

A further object of the present invention is to provide an apparatus and method for controlling a DEMUX and a MUX for use in rate matching in an uplink transmitting device of a mobile communication system.

Still another object of the present invention is to provide an apparatus and method for controlling a DEMUX and a MUX for use in the rate matching of a turbo-encoded signal in an uplink transmitting device of a mobile communication system.

To achieve the above and other objects, there is provided a transmitting device in a mobile communication system. In the preferred embodiments of the transmitting device, an encoder receives an information bit stream in a frame as long as an integer multiple of a predetermined size and generates an information symbol and first and second parity symbols by encoding each information bit. An interleaver sequentially arranges information symbols and the first and second parity symbols corresponding to each of the information symbols row by row in an array having a number of rows and a number of columns. The number of rows and the number of columns in the array are both integers. The interleaver reorders the columns according to a predetermined rule, reading the symbols down by column from left to right, and outputs a plurality of radio frames in a stream, each radio frame having a size determined by L/(TTI/10 ms), where L is number of coded symbols. A demultiplexer demultiplexes each of the radio frames received from the interleaver to the information symbols, the first parity symbols, and the second parity symbols of the radio frame. Rate matchers bypass the information symbols and puncture or repeat the first and second parity symbols for rate matching.

BRIEF DESCRIPTION OF THE DRAWINGS

The above and other objects, features and advantages of the present invention will become more apparent from the following detailed description when taken in conjunction with the accompanying drawings in which:

FIG. 4 illustrates an example of $1^{st}$-interleaver input with coding rate R=⅓ in the uplink transmitting device of FIG. 2;

FIGS. 5A, 5B, and 5C illustrate examples of $1^{st}$-interleaver output with R=⅓ in the uplink transmitting device of FIG. 2;

FIG. 6 illustrates an example of $1^{st}$-interleaver input with R=½ in the uplink transmitting device of FIG. 2;

FIGS. 7A, 7B, and 7C illustrate examples of $1^{st}$-interleaver output with R=½ in the uplink transmitting device of FIG. 2;

FIGS. 8A to 8D illustrate examples of radio frame segmenter output in the uplink transmitting device of FIG. 2;

FIGS. 9A, 9B, and 9C illustrate $1^{st}$-interleaver input, $1^{st}$-interleaver output, and radio frame segmenter output according to a first embodiment of the present invention;

FIGS. 10A, 10B, and 10C illustrate $1^{st}$-interleaver input, $1^{st}$-interleaver output, and radio frame segmenter output according to a second embodiment of the present invention;

FIGS. 11A to 11D illustrate $1^{st}$-interleaver input, $1^{st}$-interleaver output, and radio frame segmenter output according to a third embodiment of the present invention;

FIGS. 12A, 12B, and 12C illustrate $1^{st}$-interleaver input, $1^{st}$-interleaver output, and radio frame segmenter output according to a fourth embodiment of the present invention;

DETAILED DESCRIPTION OF THE PREFERRED EMBODIMENTS

Preferred embodiments of the present invention will be described hereinbelow with reference to the accompanying drawings. In the following description, well-known functions or constructions are not described in detail since they would obscure the invention in unnecessary detail.

Figure 1:
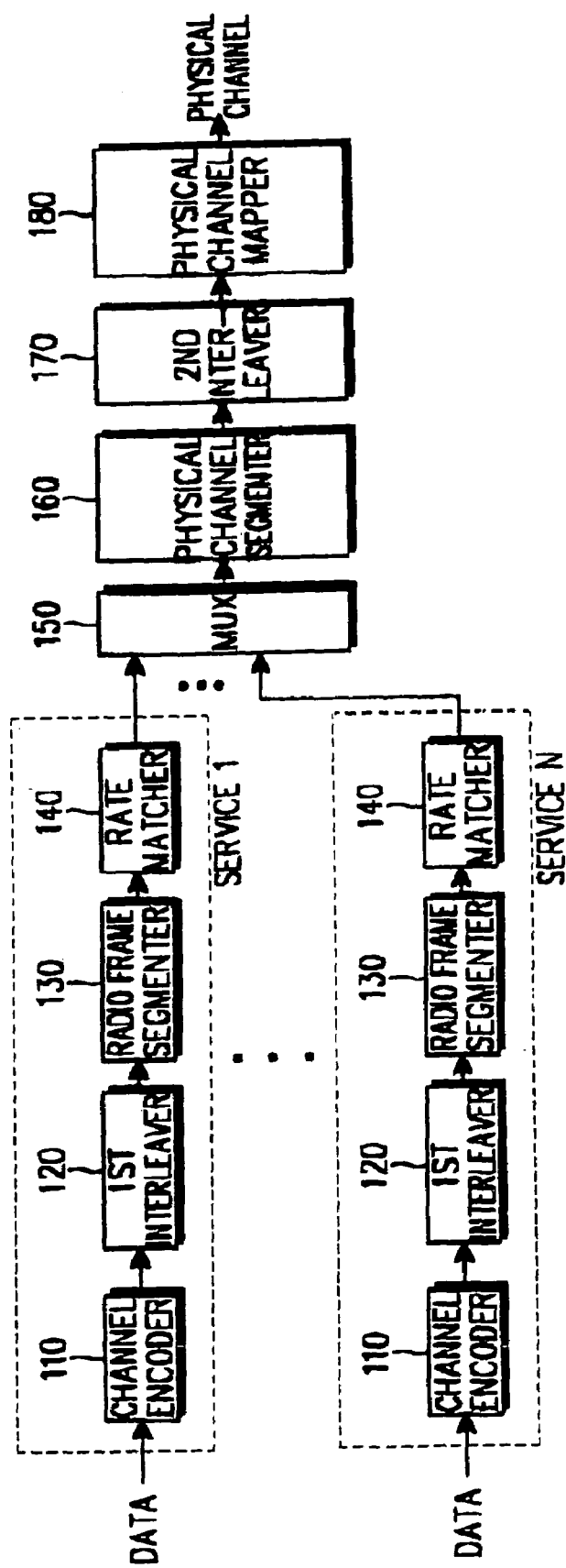
FIG. 1 is a block diagram of an uplink transmitting device in a conventional mobile communication system.
Figure 2:
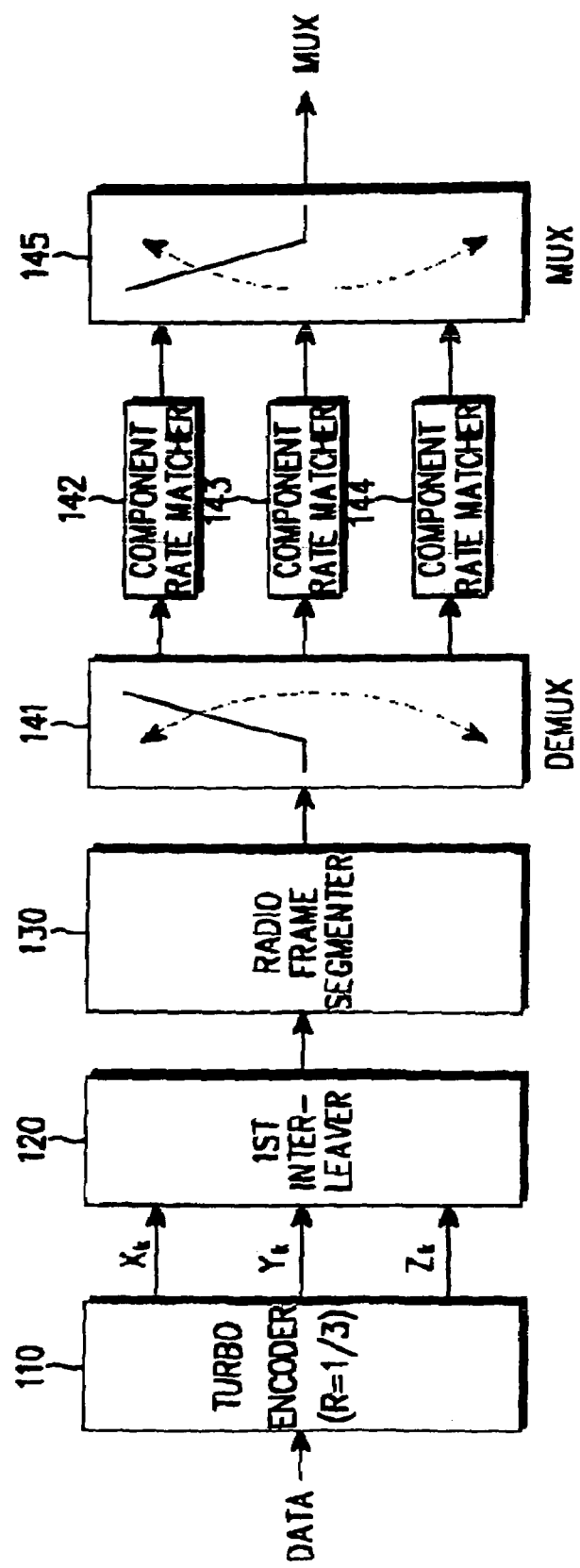
FIG. 2 is a block diagram of an uplink transmitting device provided with a DEMUX and a MUX for rate matching, according to the preferred embodiments of the present invention.

For rate matching, the UMTS uplink transmitting device of FIG. 1 has rate matcher 140 that varies in structure depending on whether channel encoder 110 is a convolutional encoder or a turbo encoder, as stated before. When a turbo encoder is used as the channel encoder 110 according to the preferred embodiments of the present invention, the rate matcher 140 is so constituted as to include a DEMUX 141, component rate matchers 142, 143, and 144, and a MUX 145, as shown in FIG. 2. The DEMUX 141 separates the output symbols of the radio frame segmenter 130 into information symbols and parity symbols and switches them to the corresponding component rate matchers 142, 143, and 144. The MUX 145 multiplexes symbols received from the component rate matchers 142, 143, and 144 and feeds the multiplexed symbols to the MUX 150 of FIG. 1.

The uplink transmitting device shown in FIG. 2 is so constituted that the systematic information symbols of encoded symbols is not punctured in view of the fact that a turbo code is a systematic code. It is preferred that the two component encoders are connected in parallel in the turbo encoder and that the minimum free distance between final codes maximizes that of each component encoder. The consideration that the best performance can be achieved by equal puncturing of the output symbols of the two component encoders is reflected in the constitution of the uplink transmitting device in FIG. 2.

According to the preferred embodiments of the present invention, the DEMUX 141 is located between radio frame segmenter 130 and component rate matchers 142, 143, and 144, while MUX 145 is located between component rate matchers 142, 143, and 144 and MUX 150 in the uplink transmitting device.

In the embodiment of the present invention shown in FIG. 2, the DEMUX 141 and MUX 145 are synchronized with each other such that the DEMUX 141 and MUX 145 switch to the same rate matcher block (i.e., if DEMUX 141 switches to rate matcher 142 to input a symbol into the DEMUX 141, then MUX also switches to the rate matcher 142 after the input symbol has been rate matched to receive the rate matched symbol.).

The turbo code used in turbo encoder 110 of FIG. 2 is a systematic code and, thusly, can be separated into a systematic information symbol $X_k$ and parity symbol $Y_k$ and $Z_k$. For turbo encoder 110, code rate R=⅓. Hereinafter, the systematic information symbol will be labeled with x and the first parity symbols with y and second parity symbols with z. When R=⅓, the relationship between the input and output of the turbo encoder 110 is shown in FIG. 3.

Figure 3:
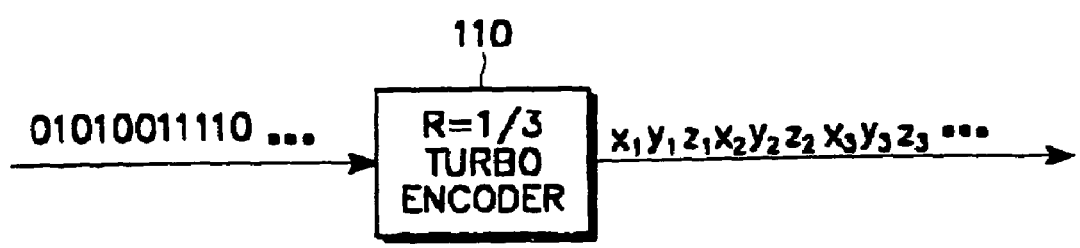
FIG. 3 illustrates an example of turbo encoder input and turbo encoder output in the uplink transmitting device of FIG. 2.

Referring to FIG. 3, the turbo encoder output is a sequence of an information symbol $x_1$, a first parity symbol $y_1$, a second parity symbol $z_1$, an information symbol $x_2$, a first parity symbol $y_2$, a second parity symbol $z_2$, an information symbol $x_3$, a first parity symbol $y_3$, a second parity symbol $z_3$, . . . in this order.

The 1$^{st}$ interleaver 120 interleaves encoded symbols at a TTI (Transmission Time Interval) according to the number of input symbols. Interleaving can be considered in two steps.

First Step

1. The total number of columns is determined referring to Table 1 shown below.

2. A minimum integer $R_1$ is found in an equation given by $$K_1 \leq R_1 \times C_1 \qquad (1)$$

where $R_1$ is the number of rows, $K_1$ is the length of the input block (total encoded symbols), and $C_1$ is the number of columns, wherein the number of columns $C_1$ is 1, 2, 4 or 8 according to TTIs.

3. The input symbols of the 1$^{st}$-interleaver are sequentially arranged by rows in an rectangular array having $R_1$ rows and $C_1$ columns.

Second Step

1. Columns are reordered according to an inter-column permutation pattern $\{P_1(j)\}j=0, 1, \ldots, C-1)$ shown in Table 1. $P_1(j)$ represents the original column of a $j^{th}$ permuted column and the pattern is derived by a bit reverse method. In the bit reverse method, the binary bit sequence of each number is reversed, e.g., 00→00, 01→10, 10→01, and 11→11, as shown by the 40 ms TTI row in Table 1.

TABLE 1

| TTI | Total number of columns | inter-column permutation patterns |
| --- | --- | --- |
| 10 ms | 1 | {0} |
| 20 ms | 2 | {0, 1} |
| 40 ms | 4 | {0, 2, 1, 3} |
| 80 ms | 8 | {0, 4, 2, 6, 1, 5, 3, 7} |

2. The 1$^{st}$-interleaver output is a sequence resulting from reading the permuted $R_1 \times C_1$ array by columns. Bits that do not exist in the 1$^{st}$-interleaver input are excluded from outputting by eliminating 11 defined as $$I_1 = R_1 \times C_1 - K_1 \qquad (2)$$

By interleaving using Eqs. 1 and 2, the 1$^{st}$ interleaver 120 outputs interleaved symbols in a similar pattern as a turbo encoder output pattern, that is, in the pattern of x, y, z, x, y, z, . . . (or x, z, y, x, z, y, . . . with parity symbols z and y exchanged in position).

When TTI is 10 ms, the number of columns $C_1$ is 1. Therefore, the 1$^{st}$ interleaver input and the 1$^{st}$ interleaver output are identical.

FIG. 4 illustrates an example of 1$^{st}$-interleaver input after turbo-encoding 160 input bits at R=⅓ and the TTI=80 ms. In FIG. 4, a blank rectangle denotes a system information symbol x, a rectangle marked with slant lines denotes a first parity symbol y, and a rectangle marked black denotes a second parity symbol z.

In FIG. 4, the 1$^{st}$ interleaver 120 sequentially receives code symbols 1, 2, 3, 4, 5, 6, 7, 8, 9, 10, . . . , 160 from the turbo encoder 110. Each number represents an order of encoded symbol received from the turbo encoder 110. The numbers also indicate the order by which each of the numbers has been received in the interleaver 120 (i.e., '1' has been received first by the interleaver 120, '2' has been received second, etc.). Because of the nature of a turbo code, the 1$^{st}$-interleaver input follows the pattern of x, y, z, x, y, z, x, y, Z, . . . .

FIG. 5A illustrates an example of 1$^{st}$-interleaver output when R=⅓ and TTI=20 ms. Referring to FIG. 5A, the 1$^{st}$-interleaver output sequence is 1, 3, 5, 7, 9, 11, 13, 15, 17, 19, . . . , 160 in an interleaved order in the pattern of x, z, y, x, z, y, x, z, y, . . . .

FIG. 5B illustrates an example of 1$^{st}$-interleaver output when R=⅓ and TTI=40 ms. Referring to FIG. 5B, the 1$^{st}$-interleaver output sequence is 1, 5, 9, 13, 17, 21, 25, 29, 33, . . . , 160 in an interleaved order in the pattern of x, y, z, x, y, z, x, y, z . . . .

FIG. 5C illustrates an example of 1$^{st}$-interleaver output when R=⅓ and TTI=80 ms. Referring to FIG. 5C, the 1$^{st}$-interleaver output sequence is 1, 9, 17, 25, 33, 41, 49, 57, 65, . . . , 160 in an interleaved order in the pattern of x, z, y, x, z, y, x, z, y . . . .

FIG. 6 illustrates an example of 1$^{st}$-interleaver input after turbo encoding 160 input bits at code rate R=½ and TTI=80 ms. When TTI=10 ms, the 1$^{st}$-interleaver input is identical to the 1$^{st}$-interleaver output. In FIG. 6, a blank rectangle denotes a system information symbol x and a rectangle marked with black dots denotes a parity symbol y.

In FIG. 6, the 1$^{st}$ interleaver 120 sequentially receives encoded symbols 1, 2, 3, 4, 5, 6, 7, 8, 9, 10, . . . , 160 from the turbo encoder 110. Each number represents an order of encoded symbol received from the turbo encoder 110. Because of the nature of the turbo code, the 1$^{st}$-interleaver input follows the pattern of x, y, x, y, x, y, . . . .

FIG. 7A illustrates an example of 1$^{st}$-interleaver output when R=½ and TTI=20 ms. Referring to FIG. 7A, the 1$^{st}$-interleaver output sequence is 1, 3, 5, 7, 9, 11, 13, 15, 17, 19, . . . , 159, 2, 4, 6, 8, . . . , 160 in an interleaved order. The first half {1, 3, 5, . . . , 159} of the interleaver output is information symbols x, and the last half {2, 4, 6, . . . , 160} is parity symbols y. That is, the information symbols are followed by the parity symbols in the 1$^{st}$-interleaver output.

FIG. 7B illustrates an example of 1$^{st}$-interleaver output when R=½ and TTI=40 ms. Referring to FIG. 7B, the 1$^{st}$-interleaver output sequence is 1, 5, 9, 13, . . . , 155, 159, 2, 6, 10, 14, . . . , 156, 160 in an interleaved order. The first half {1, 5, 9, 13, . . . , 159} of the interleaver output is information symbols x, and the last half {2, 6, 10, 14, . . . , 156, 160} is parity symbols y. That is, the information symbols are followed by the parity symbols in the 1$^{st}$-interleaver output.

FIG. 7C illustrates an example of 1$^{st}$-interleaver output when R=½ and TTI=80 ms. Referring to FIG. 7C, the 1$^{st}$-interleaver output sequence is 1, 9, 17, 25, . . . , 127, 135, 143, 151, 159, 2, 10, 18, . . . , 144, 152, 160 in an interleaved order. The first half {1, 9, 17, 25, . . . , 143, 151, 159} of the interleaver output is information symbols x, and the last half {2, 10, 18, ..., 144, 152, 160} is parity symbols y. That is, the information symbols are followed by the parity symbols in the $1^{st}$-interleaver output.

The interleaver outputs shown in FIGS. 5A, 5B, and 5C are given on the assumption that an interleaver size (=160) is an integer multiple of TTI/10 ms (=1, 2, 4, or 8). In case an interleaver size is not an integer multiple of TTI/10 ms, a different $1^{st}$-interleaver output is produced.

The radio frame segmenter 130 of FIG. 2 segments a frame of 10, 20, 40, or 80 ms into 10-ms radio frame blocks. Because the ratio (L/T) of an input frame size (L) to the TTI (T=TTI/10 ms) of an input frame is not always an integer, the number (r) of filler bits is calculated by Eq. 3 to compensate for L/T with the filler bits (L is in units of bits or symbols). Here, T $\epsilon$ {1, 2, 4, 8}. If the input frame size (number of coded symbols) of the first interleaver is an integer multiple of TTI/10 ms, the filler bit is not needed (r=0). If the TTI is 20 ms and the input frame size is not an integer multiple of 2(TTI/10 ms), the number of filler bits r is 1. If the TTI is 40 ms and the input frame size is not an integer multiple of 4, the number of filler bit r can be 1, to 3. If the TTI is 80 ms and the input frame size is not an integer multiple of 8, the number of filler bits can be 1 to 7. The (L+r)/T value resulting from the filler bits is defined as R(number of row).

$$r = T - (L \bmod T) \text{ where } r \epsilon \{0, 1, 2, 3, \ldots T-1\}. \quad (3)$$

$$R_i = (L_i + r_i)/T_i \quad (4)$$

If r is not 0, the radio frame segmenter 130 inserts a filler bit into the last bit position of a corresponding frame from a $(T-r+1)^{th}$ radio frame in order to maintain a radio frame size of R. The filler bit is arbitrarily chosen as a 0 or 1. Now a description will be made of the bit-basis operation of the radio frame segmenter 130.

For description of bits prior to processing in the radio frame segmenter 130, it is assumed that the number of filler bits r has been calculated. Here, t represents the index of a radio frame, ranging from 1 through T ($1 \leq t \leq T$). t=1 for the first radio frame, t=2 for the second radio frame, and similarly, t=T for the last radio frame. Each radio frame is the same size (L+r)/T. It is assumed that the $1^{st}$-interleaver output is $b_1, b_2, \ldots, b_L$, T (=TTI/10 ms) $\epsilon$ {1, 2, 4, 8}, and the radio frame segmenter output symbols are $c_1, c_2, \ldots, c_{(L+r)/T}$ in a 10-ms frame. Then,

TABLE 2

| output symbols of the radio frame segmenter for the first 10 msec: t = 1 | |
|---|---|
| $c_j = b_j$ | j = 1, 2, ..., (L + r)/T |
| output symbols of the radio frame segmenter for the second 10 msec: t = 2 | |
| $c_j = b_{(j+(L+r)/T)}$ | j = 1, 2, ..., (L + r)/T |
| . | |
| . | |
| . | |
| output symbols of the radio frame segmenter for the (T − r)$^{th}$ 10 msec: t = (T − r) | |
| $c_j = b_{(j+(T-r-1)(L+r)/T)}$ | j = 1, 2, ..., (L + r)/T |
| output symbols of the radio frame segmenter for the (T − r + 1)$^{th}$ 10 msec: t = (T − r + 1)$^{th}$ | |
| $c_j = b_{(j+(T-r)(L+r)/T)}$ | j = 1, 2, ..., (L + r)/T − 1 |
| $c_j = $ filler_bit (0/1) | j = (L + r)/T |
| . | |
| . | |
| . | |
| output bits of the radio frame segmenter for the T$^{th}$ 10 msec: t = T | |
| $c_j = b_{(j+(T-1)(L+r)/T)}$ | j = 1, 2, ..., (L + r)/T − 1 |
| $c_j = $ filler_bit (0/1) | j = (L + r)/T |

The purpose of using the component rate matchers 142, 143, and 144 of FIG. 2 is to increase the data transmission efficiency and improve system performance in a multiple-access/multiple-channel system using the above-described channel encoding mechanism. Rate matching refers to control of input bit number to output bit number through puncturing when the input size is larger than the output size or repetition when the input size is smaller than the output size. The symbol puncturing or repetition is generally performed periodically but the following should be considered for rate matching when a turbo code is used.

1. Because the turbo code is a systematic code, a systematic information symbol part of encoded symbols should be excluded from puncturing.

2. The minimum free distance between final codes preferably maximizes that of each component encoder since two component encoders are connected in parallel in a turbo encoder by definition of a turbo code. Therefore, the output symbols of the two component encoders should be equally punctured to achieve optimal performance.

In the rate matching structure shown in FIG. 2, rate matching is implemented separately for each component rate matcher. The first, second, and third component rate matchers 142, 143, and 144 subject an information symbol x, a first parity symbol y, and a second parity symbol z, respectively, to rate matching. According to a given input and output sizes, each rate matcher performs puncturing/repetition on a predetermined number of symbols. This rate matching structure is built on the assumption that the DEMUX 141 outputs x, y, z, separately. Hence, the DEMUX 141 should be able to separate a radio frame received from the radio frame segmenter 130 into symbols x, y, z in a certain order.

A description of radio frame output patterns of the radio frame segmenter 130 will be given. Radio frames are read down by columns and each column corresponds to a radio frame.

Figure 8A:
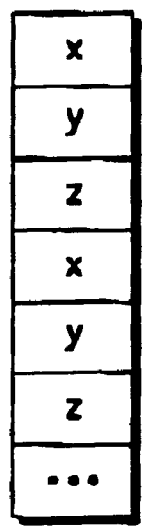

FIG. 8A illustrates an output pattern of the radio frame segmenter 130 when R=⅓ and TTI=10 ms. Referring to FIG. 8A, a radio frame output pattern is identical to a radio frame input pattern, that is, x, y, z, x, y, z, . . . .

Figure 8B:
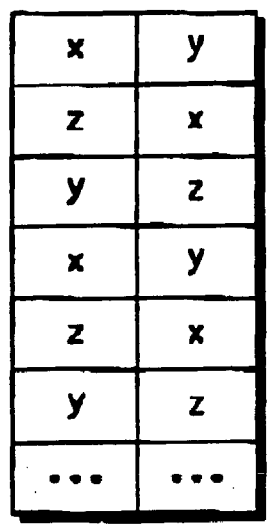

FIG. 8B illustrates an output pattern of the radio frame segmenter 130 when code rate R=⅓ and TTI=20 ms. Referring to FIG. 8B, a first radio frame RF #1 is output in the pattern of x, z, y, x, z, y, . . . and a second radio frame RF #2 is output in a radio frame pattern of . . . , x, y, x, z, y, x, z, . . . . The output patterns correspond to the output from the $1^{st}$ interleaver shown in FIG. 5A.

FIG. 8C illustrates an output pattern of the radio frame segmenter 130 when R=⅓ and TTI=40 ms. Referring to FIG. 8C, a first radio frame RF #1 is output in the pattern of . . . , x, y, z, x, y, z, . . . , a second radio frame RF #2 in the pattern of . . . , z, x, y, z, x, y, . . . , a third radio frame RF #3 in the pattern of . . . , y z, x, y, z, x, . . . , and a fourth radio frame RF #4 in the pattern of . . . , x, y, z, x, y, z, . . . . The output patterns correspond to the output from the $1^{st}$ interleaver shown in FIG. 5B.

FIG. 8D illustrates an output pattern of the radio frame segmenter 130 when R=⅓ and TTI=80 ms. Referring to FIG. 8D, a first radio frame RF #1 is output in the pattern of . . . , x, z, y, x, z, y, . . . , a second radio frame RF #2 in the pattern of . . . , y, x, z, y, x, z, . . . , a third radio frame RF #3 in the pattern of . . . , z, y, x, z, y, x, . . . , a fourth radio frame RF #4 in the pattern of . . . , x, z, y, x, z, y, . . . , a fifth radio frame RF #5 in the pattern of . . . , y, x, z, y, x, z, . . . , a sixth radio frame #6 in the pattern of . . . , z, y, x, y, x, a seventh radio frame RF #7 in the pattern of . . . , x, z, y, x, z, y, . . . , and an eighth radio frame RF #8 in the pattern of . . . , y, x, z, y, x, z, . . . . The output patterns correspond to the output from the 1$^{st}$ interleaver shown in FIG. 5C.

Output patterns of the radio frame segmenter 130 have a certain regularity. Each radio frame pattern with the same TTI has a different initial symbol x, y, or z but has the same symbol repeating pattern. For TTIs=10 ms and 40 ms, symbols are repeated in the pattern of . . . , x, y, z, x, y, z, . . . , and for TTIs=20 ms and 80 ms, symbols are repeated in the pattern of x, z, y, x, z, y, . . . .

The radio frames in the above cases are free of a filler bit. This is because the input size is an integer multiple of TTI/10 ms. When filler bits are to be inserted, radio frames have different patterns from the above-described patterns. The first through fourth embodiments as described below pertain to insertion of filler bits.

FIRST EMBODIMENT

FIGS. 9A, 9B, and 9C illustrate 1$^{st}$-interleaver input, 1$^{st}$-interleaver output, and radio frame segmenter output according to a first embodiment of the present invention.

If the input of the 1$^{st}$ interleaver 120 for TTI=80 ms is given in FIG. 9A, it is interleaved by columns according to an interleaving rule of the 1$^{st}$ interleaver 120, as shown in FIG. 9B. Then, symbols are read down each column starting from the left to the right column in the array of FIG. 9B. The resulting 1$^{st}$-interleaver output (i.e., the radio segmenter input) is x, z, y, x, z, y, x, z, y, z, y, x, z, y, x, z, y, x, z, y, x, z, y, x, z, y, X, z, y, x, z, y. The output of the radio frame segmenter 130 results from adding filler bits to the radio frame segmenter input.

In the first embodiment, the filler bits are 0s. In the first embodiment of the present invention, the radio frame segmenter 130 outputs the symbols received from the interleaver 120 in a such way that the all of the filler bits are placed towards the end of the last row, as shown in FIG. 9C. In FIG. 9B, the last positions in the second, fourth, sixth and eight columns are empty. Instead of filling those positions with filler bits, the next symbol coming after the empty position is used to fill the empty position. For example, to fill the last position in the second column, the 'z' symbol from the first position in the third column is moved in to the empty position in the second column. The position previously occupied by the 'z' symbol is now occupied by the 'y' symbol which came after the 'z' symbol in the third column. Basically the positions of the symbols have been pushed up by one position. This process is repeated to fill the empty position in the fourth column, and so on. However, the last positions in the last four columns (i.e., column #5, 6, 7 and 8) are filled with the filler bits so that the filler bits are pushed towards the end of the last row, as shown in FIG. 9C. Symbols in the array of FIG. 9C are read column by column and each column represents one radio frame. As shown in FIG. 9C, each radio frame has a different initial symbol but follows the same symbol repeating pattern of x, z, y, except for radio frames 4 and 6 because of the position shifting. However, the repeating patterns for the radio frames 4 and 6, which are shown below in Table 15, can be used. The patterns in the radio frames follow the predetermined repeating patterns shown in Table 15 except for the tail ends of certain radio frames. In those cases, the tail ends are ignored and treated as if the tail ends follow the predetermined repeating patterns shown in Table 15 and are rated matched according to the predetermined repeating patterns. That is, the radio frames have different initial symbols in the filler bit inserting case, as compared to the filler bit-free case.

Although filler bits are inserted, radio frames may have the same initial symbols as those in the filler bit-free case. An example of such a case using three filler bits for TTI=40 ms will be described.

FIGS. 10A and 10B illustrate 1$^{st}$-interleaver input, 1$^{st}$-interleaver output, and radio frame segmenter output according to the first embodiment.

If the input of the 1$^{st}$ interleaver 120 for TTI=40 ms is given in FIG. 10A, it is interleaved by columns according to an interleaving rule of the 1$^{st}$ interleaver 120 as shown in FIG. 10B. The resulting 1$^{st}$-interleaver output (i.e., the radio segmenter input) is x, y, z, x, y, z, z, x, y, z, x, y, z, x, y, z, x, y, z, x, y. The output of the radio frame segmenter 130 shown in FIG. 10C results from adding filler bits to the radio frame segmenter input.

The filler bits are 0s. Symbols in the array of FIG. 10C are read column by column and each column represents one radio frame. As shown in FIG. 10C, each radio frame has a different initial symbol but follows the same symbol repetition pattern of . . . , x, y, z, . . . . That is, the radio frames have the same initial symbols in this filler bit inserting case as those in the filler bit-free case.

The initial symbol of each radio frame is determined by a TTI and the number of filler bits added by the radio frame segmenter 130. Herein below, initial symbols in all possible cases will be described. Tables 3 to 6 list initial symbols for TTIs=10, 20, 40, and 80 ms, respectively, when the radio frame segmenter 130 outputs radio frames RF#1, RF #2, RF #3, RF #4, RF #5, RF #6, RF #7, and RF #8 sequentially.

TABLE 3

| TTL = 10 ms | |
|---|---|
| total number of filler bits | Initial symbol of RF #1 |
| 0 | x |

TABLE 4

| TTL = 20 ms | | |
|---|---|---|
| | Initial symbol of | |
| total number of filler bits | RF #1 | RF #2 |
| 0, 1 | X | y |

In Table 4, since the 1$^{st}$ interleaver 120 leaves the columns intact, positions are not changed when one filler bit is used. Consequently, the initial symbols are the same as those in the filler bit-free case.

TABLE 5

| TTL = 40 ms | | | | |
|---|---|---|---|---|
| | Initial symbol of | | | |
| total number of filler bits | RF #1 | RF #2 | RF #3 | RF #4 |
| 0, 1, 3 | x | z | y | x |
| 2 | x | z | z | x |

When one or three filler bits are used, the number of symbols in each column before interleaving is equal to that of symbols in the column of the same index after interleaving. Therefore, the initial symbols are the same as those in the filler bit-free case. If two filler bits are used, the number of symbols in each column before interleaving is different from that of symbols in the column of the same index after interleaving. Therefore, the initial symbols are different from those in the filler bit-free case.

TABLE 6

TTI = 80 ms initial symbol of

| total number of filler bits | RF #1 | RF #2 | RF #3 | RF #4 | RF #5 | RF #6 | RF #7 | RF #8 |
|---|---|---|---|---|---|---|---|---|
| 0, 1, 7 | x | y | z | x | Y | z | x | y |
| 2, 3 | x | y | z | x | X | y | z | y |
| 4 | x | y | y | z | Z | y | z | y |
| 5, 6 | x | y | y | z | X | z | x | y |

When one or seven filler bits are used, the number of symbols in each column before interleaving is equal to that of symbols in the column of the same index after interleaving. Therefore, the initial symbols are the same as those in the filler bit-free case. If two, three, four, five, or six filler bits are used, the number of symbols in each column before interleaving is different from that of symbols in the column of the same index after interleaving. Therefore, the initial symbols are different from those in the filler bit-free case.

As noted from the above tables, symbols are repeated in the pattern of x, y, z, x, y, z, for TTIs=10 ms and 40 ms, whereas symbols are repeated in the pattern of x, z, y, x, z, y, for TTIs=20 ms and 80 ms.

Therefore, given a TTI and the number of filler bits to be inserted by the radio frame segmenter 130, the DEMUX 141 demultiplexes $1^{st}$-interleaver output in the above-described manner.

SECOND EMBODIMENT

FIGS. 11A to 11D illustrate $1^{st}$-interleaver input, $1^{st}$-interleaver output, and radio frame segmenter output according to a second embodiment of the present invention. The second embodiment is different from the first embodiments in that filler bits are inserted by the $1^{st}$ interleaver 120 instead of the radio frame segmenter 130. Instead of pushing the filler bit positions to the end of the last row, as in the first embodiment (i.e., FIG. 9C), the interleaver 120 fills the empty positions with filler bits, as shown in FIG. 11C. In terms of initial symbols and repeating patterns, this case is the same as the typical filler bit-free case.

If the input of the $1^{st}$ interleaver 120 for TTI=80 ms is given as in FIG. 11A, it is interleaved by columns according to an interleaving rule of the $1^{st}$ interleaver 120 as shown in FIG. 11B. Then, filler bits are inserted to the array of FIG. 11B as shown in FIG. 11C. Here, the filler bits are 0s. Therefore, the $1^{st}$-interleaver output, i.e., the radio frame segmenter input is a sequence of x, z, y, x, z, y, z, y, 0, z, y, x, z, y, x, z, y, x, 0, y, x, z, y, x, z, y, x, z, 0, x, z, y, x, z, y, x, z, y, 0. The output of the radio frame segmenter 130 is shown in FIG. 11D.

The symbols in the array of FIG. 11D are read down by column from left to right and each column is a radio frame. As shown in FIG. 11D, each radio frame follows the same repeating pattern of x, z, y with a different initial symbol. As noted from FIGS. 11A to 11D, the initial symbols are the same as those in the general filler bit-free case.

The initial symbol of each radio frame is determined by a TTI. Tables 7 to 10 list initial symbols for TTIs=10, 20, 40, and 80 ms, respectively, when the radio frame segmenter 130 outputs radio frames RF#1, RF #2, RF #3, RF #4, RF #5, RF #6, RF #7, and RF #8 sequentially. The initial symbols of the radio frames in the second embodiment are independent of the total number of the filler bits, as shown below; however, in the first embodiment, the initial symbols of the radio frames are dependent on the total number of the filler bits.

TABLE 7

TTI = 10 ms
initial symbol of

| RF #1 |
|---|
| x |

TABLE 8

TTI = 20 ms
initial symbol of

| RF #1 | RF #2 |
|---|---|
| x | y |

TABLE 9

TTI = 40 ms
initial symbol

| RF #1 | RF #2 | RF #3 | RF #4 |
|---|---|---|---|
| x | z | y | x |

TABLE 10

TTI = 80 ms
initial symbol of

| RF #1 | RF #2 | RF #3 | RF #4 | RF #5 | RF #6 | RF #7 | RF #8 |
|---|---|---|---|---|---|---|---|
| x | y | z | x | y | z | x | y |

As noted from the above tables, symbols are repeated in the pattern of x, y, z, x, y, z, for TTIs=10 ms and 40 ms, whereas symbols are repeated in the pattern of x, z, y, x, z, y, for TTIs=20 ms and 80 ms.

Therefore, given a TTI, the DEMUX 141 demultiplexes $1^{st}$-interleaver output in the above-described manner.

THIRD EMBODIMENT

FIGS. 12A, 12B, and 12C illustrate $1^{st}$-interleaver input, $1^{st}$-interleaver output, and radio frame segmenter output according to a third embodiment of the present invention. The third embodiment is different from the second embodiments in that a controller (host) designates filler bit insertion positions and the radio frame segmenter 130 inserts the filler bits in the designated positions. In terms of initial symbols and repeating patterns, this case is the same as the typical filler bit-free case.

If the input of the $1^{st}$ interleaver 120 for TTI=80 ms is given in FIG. 12A, it is interleaved by columns according to an interleaving rule of the $1^{st}$ interleaver 120 as shown in FIG. 12B. Therefore, the $1^{st}$-interleaver output, i.e., the radio frame segmenter input is a sequence of x, z, y, x, z, y, x, z, y, z, y, x, z, y, x, z, y, x, y, x, z, y, x, z, y, x, z, x, z, y, x, z, y, x, z, y. A controller (host) designates filler bit insertion positions and then the radio frame segmenter 130 inserts the filler bits in the designated positions as shown in FIG. 12C.

In this embodiment, the filler bits are 0s. The symbols in the array of FIG. 12C are read down column by column from left to right and each column is a radio frame. As shown in FIG. 12C, each radio frame follows the same repeating pattern of x, z, y with a different initial symbol. As noted from FIGS. 12A, 12B, and 12C, initial symbols are the same as those in the general filler bit-free case.

The initial symbol of each radio frame is determined by a TTI. Tables 11 to 14 list initial symbols for TTIs=10, 20, 40, and 80 ms, respectively, when the radio frame segmenter 130 outputs radio frames RF#1, RF #2, RF #3, RF #4, RF #5, RF #6, RF #7, and RF #8 sequentially. The initial symbols of the radio frames in the third embodiment are independent of the total number of the filler bits, as shown below.

TABLE 11

| TTI = 10 ms initial symbol of RF #1 |
|---|
| x |

TABLE 12

| TTI = 20 ms initial symbol of | |
|---|---|
| RF #1 | RF #2 |
| x | y |

TABLE 13

| TTL = 40 ms initial symbol | | | |
|---|---|---|---|
| RF #1 | RF #2 | RF #3 | RF #4 |
| x | z | y | x |

TABLE 14

| TTL = 80 ms initial symbol of | | | | | | | |
|---|---|---|---|---|---|---|---|
| RF #1 | RF #2 | RF #3 | RF #4 | RF #5 | RF #6 | RF #7 | RF #8 |
| x | y | z | x | y | z | x | y |

As noted from the above tables, symbols are repeated in the pattern of x, y, z, x, y, z, for TTIs=10 ms and 40 ms, whereas symbols are repeated in the pattern of x, z, y, x, z, y, for TTIs=20 ms and 80 ms.

Given a TTI, the DEMUX 141 demultiplexes $1^{st}$-interleaver output in the above-described manner.

Returning to FIG. 2, the DEMUX 141 demultiplexes a radio frame received from the radio frame segmenter 130 into its symbols x, y, z, according to a switching rule. The switching rule is determined by a TTI and the number of filler bits used by the radio frame segmenter 130 in the first embodiment and a TTI in the second and third embodiments. The symbols are repeated in a certain pattern. The repeating patterns for the embodiments are tabulated in Tables 15 and 16. In the tables, N/A indicates "not applicable".

TABLE 15

For First Embodiment

| TTI | total number of filler bits | Switching rules (repeating patterns) | | | | | | | |
|---|---|---|---|---|---|---|---|---|---|
| | | RF #1 | RF #2 | RF #3 | RF #4 | RF #5 | RF #6 | RF #7 | RF #8 |
| 10 ms | 0 | x, y, z | N/A | N/A | N/A | N/A | N/A | N/A | N/A |
| 20 ms | 0, 1 | x, z, y | y, x, z | N/A | N/A | N/A | N/A | N/A | N/A |
| 40 ms | 0, 1, 3 | x, y, z | z, x, y | y, z, x | x, y, z | N/A | N/A | N/A | N/A |
|  | 2 | x, y, z | z, x, y | z, x, y | x, y, z | N/A | N/A | N/A | N/A |
| 80 ms | 0, 1, 7 | x, z, y | y, x, z | z, y, x | x, z, y | y, x, z | z, y, x | x, z, y | y, x, z |
|  | 2, 3 | x, z, y | y, x, z | z, y, x | x, z, y | x, z, y | y, x, z | z, y, x | y, x, z |
|  | 4 | x, z, y | y, x, z | y, x, z | z, y, x | z, y, x | y, x, z | z, y, x | y, x, z |
|  | 5, 6 | x, z, y | y, x, z | y, x, z | z, y, x | x, z, y | z, y, x | x, z, y | y, x, z |

TABLE 16

For Second and Third Embodiments

| TTI | Switching rules (repeating patterns) | | | | | | | |
|---|---|---|---|---|---|---|---|---|
| | RF #1 | RF #2 | RF #3 | RF #4 | RF #5 | RF #6 | RF #7 | RF #8 |
| 10 ms | x,y,z | N/A | N/A | N/A | N/A | N/A | N/A | N/A |
| 20 ms | x,z,y | y,x,z | N/A | N/A | N/A | N/A | N/A | N/A |
| 40 ms | x,y,z | z,x,y | y,z,x | x,y,z | N/A | N/A | N/A | N/A |
| 80 ms | x,z,y | y,x,z | z,y,x | x,z,y | y,x,z | z,y,x | x,z,y | y,x,z |

If two filler bits are used for TTI=40 ms in the first and second embodiments, the switching patterns in the DEMUX 141 are x, y, z, x, y, z for the first radio frame, z, x, y for the second radio frame, z, x, y, z, x, y for the third radio frame, and x, y, z, x, y, z for the fourth radio frame.

In the second and third embodiments, the initial symbol of each radio frame only needs to be given because the repeating patterns are already predetermined based on the TTI. However, in the first embodiment, the total number of the filler bits also needs to be given in addition to the other information. Tables 17–19 reflect that difference between the embodiments.

TABLE 17

For First Embodiment

| TTI | total number of filler bits | Initial symbol of | | | | | | | |
| --- | --- | --- | --- | --- | --- | --- | --- | --- | --- |
| | | RF #1 | RF #2 | RF #3 | RF #4 | RF #5 | RF #6 | RF #7 | RF #8 |
| 10 ms | 0 | x | N/A | N/A | N/A | N/A | N/A | N/A | N/A |
| 20 ms | 0, 1 | x | y | N/A | N/A | N/A | N/A | N/A | N/A |
| 40 ms | 0, 1, 3 | x | z | y | x | N/A | N/A | N/A | N/A |
| | 2 | x | z | z | x | N/A | N/A | N/A | N/A |
| 80 ms | 0, 1, 7 | x | y | z | x | y | z | x | y |
| | 2, 3 | x | y | z | x | x | y | z | y |
| | 4 | x | y | y | z | z | y | z | y |
| | 5, 6 | x | y | y | z | x | z | x | y |

TABLE 18

For Second and Third Embodiments

| TTI | initial symbol of | | | | | | | |
| --- | --- | --- | --- | --- | --- | --- | --- | --- |
| | RF #1 | RF #2 | RF #3 | RF #4 | RF #5 | RF #6 | RF #7 | RF #8 |
| 10 ms | x,y,z | N/A | N/A | N/A | N/A | N/A | N/A | N/A |
| 20 ms | x,z,y | y,x,z | N/A | N/A | N/A | N/A | N/A | N/A |
| 40 ms | x,y,z | z,x,y | y,z,x | x,y,z | N/A | N/A | N/A | N/A |
| 80 ms | x,z,y | y,x,z | z,y,x | x,z,y | y,x,z | z,y,x | x,z,y | y,x,z |

TABLE 19

Repeating Patterns

| TTI | Repeating patterns |
| --- | --- |
| 10 ms, 40 ms | . . . , x, y, z, x, y, z, . . . |
| 20 ms, 80 ms | . . . , x, z, y, x, z, y, . . . |

Referring to FIG. 2 again, the MUX 145 multiplexes three streams received from the component rate matchers 142, 143, and 144 to one stream, to thereby generate a rate-matched radio frame with the same symbol pattern as before rate matching. Because this MUX 145 is the counterpart of the DEMUX 141, it switches according to the same switching patterns.

Figure 13:
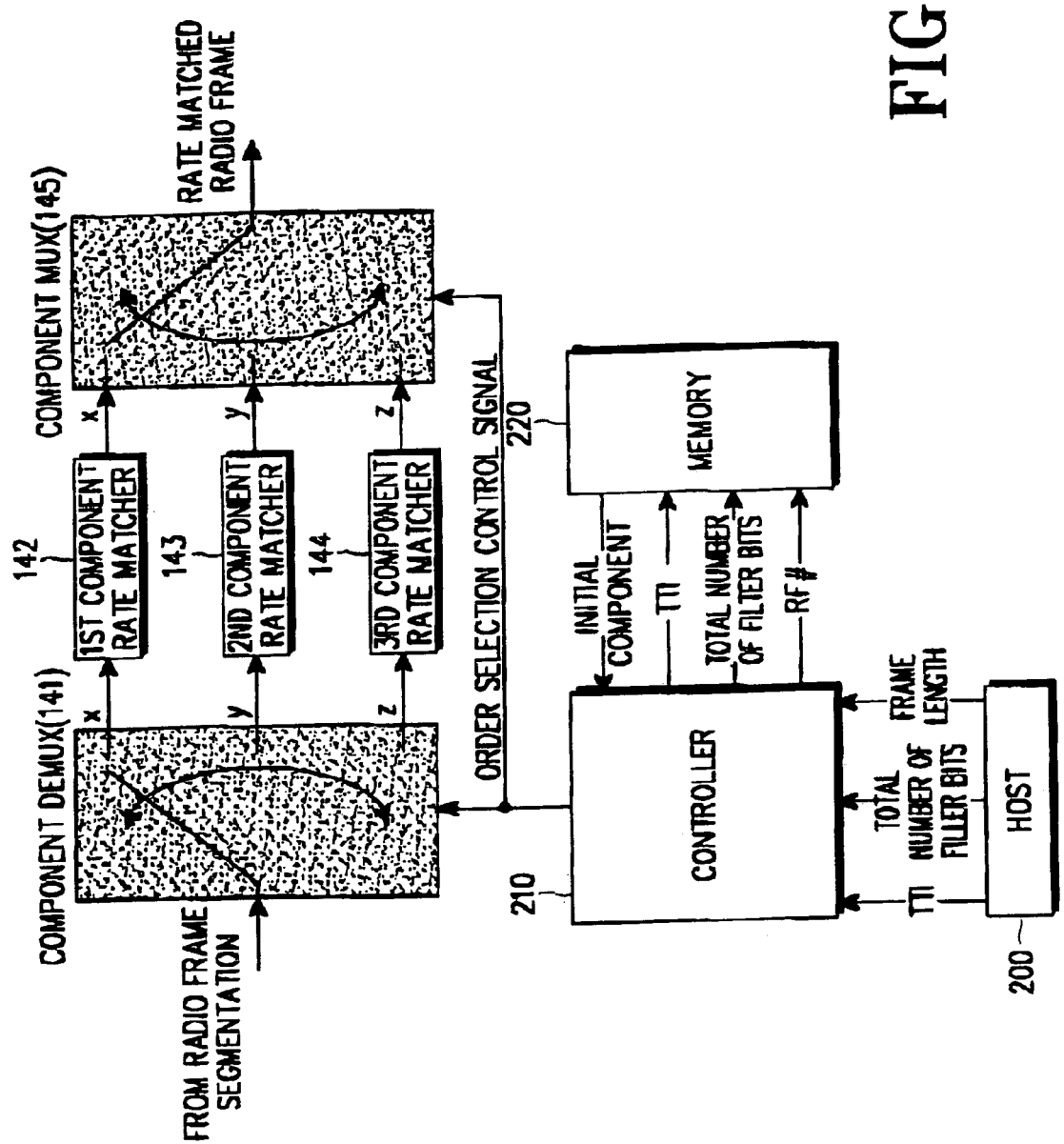
FIG. 13 is a block diagram of a DEMUX & MUX controlling apparatus according to an embodiment of the present invention.

FIG. 13 is a block diagram of a DEMUX and MUX controlling apparatus according to the first embodiment of the present invention.

Referring to FIG. 13, upon receipt of a TTI, the total number of the filler bits, and a radio frame length from the host 200, the controller 210 feeds the TTI, the total number of the filler bits, and the radio frame index of a current radio frame to the memory 220 (see Table 17) and receives the initial symbol of the current radio frame from the memory 220. The controller 210 controls the switching operations of the DEMUX 141 and the MUX 145 based on the initial symbol and a repeating/puncturing pattern determined by the TTI. The DEMUX 141 separates the current radio frame symbols into input for the corresponding component rate matchers and the MUX 145 multiplexes the output symbols of the rate matchers to a radio frame. Here, the DEMUX 141 separates an information symbol, a first parity symbol, and a second parity symbol from a radio frame stream received from the radio frame segmenter 130. The component rate matchers 142, 143, and 144 rate match the information symbol, the first parity symbol, and the second parity symbol from the DEMUX 141, respectively, by puncturing or repetition. The component rate matcher 142 just bypasses the received information symbols without real puncturing, whereas the component rate matchers 143 and 144 puncture the received parity symbols according to a preset pattern which is determined by the ratio of the number of input symbols to the number of output symbols. In most of the real cases, the component rate matchers 143 and 144 just bypass the received parity symbols without real repetition except heavy repetition of the encoded symbols, whereas the component rate matcher 142 repeats the received information symbols according to a preset pattern determined by the ratio of the number of input symbols to the number of output symbols.

The MUX 145 multiplexes the symbols received from the component rate matchers 142, 143, and 144 to one stream according to the same switching pattern as used in the DEMUX 141.

Figure 14:
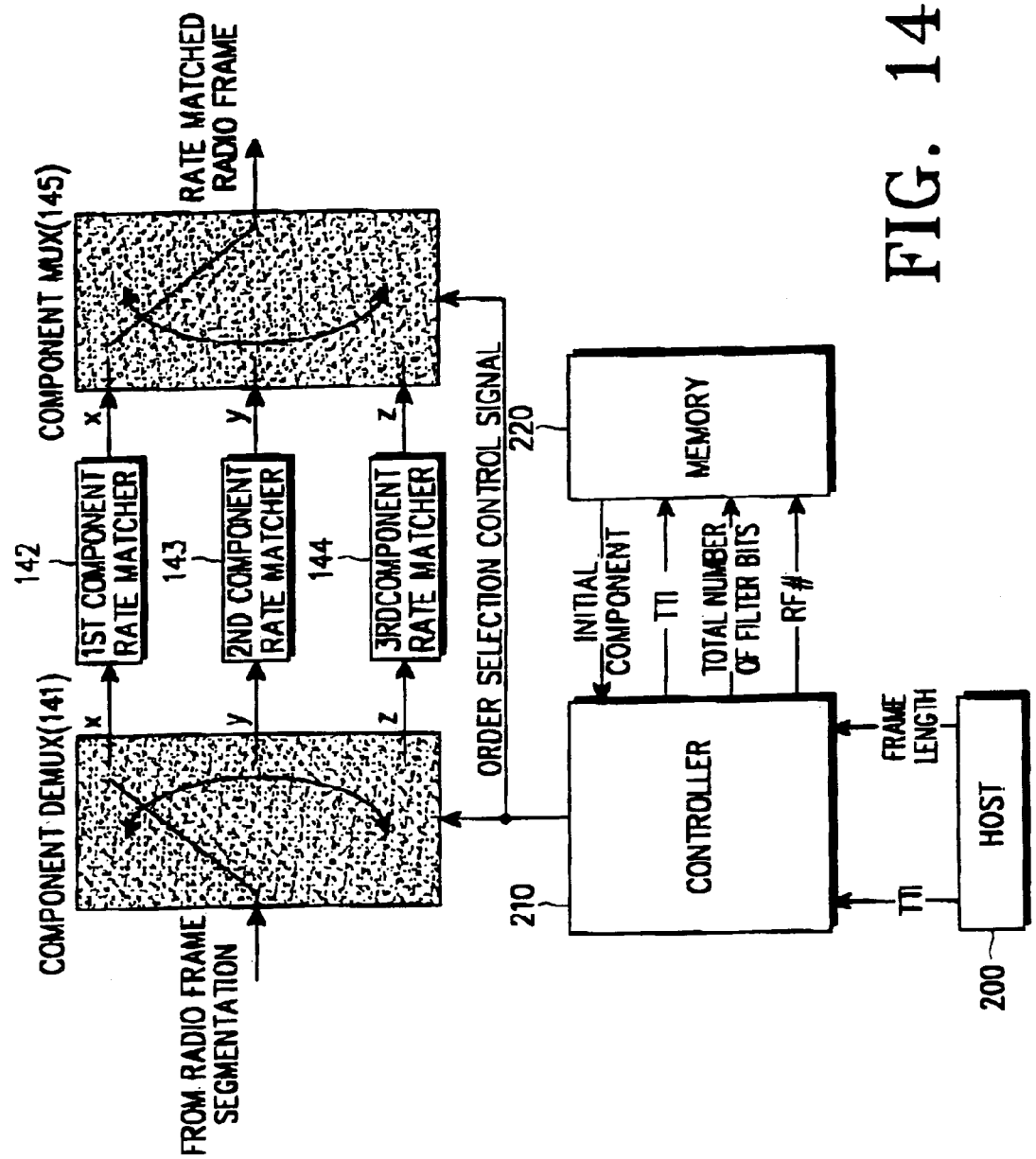
FIG. 14 is a block diagram of a DEMUX & MUX controlling apparatus according to another embodiment of the present invention.

FIG. 14 is a block diagram of a DEMUX and MUX controlling apparatus according to the second embodiment of the present invention.

Referring to FIG. 14, upon receipt of a TTI and a radio frame length from the host 200, the controller 210 feeds the TTI, the total number of filler bits, and the radio frame index of a current radio frame to memory 220 (see Table 17) and receives the initial symbol of the current radio frame from memory 220. The number of filler bits is determined by the controller 210 based on the TTI and the frame length in the same manner as used in the radio frame segmenter. Then, the controller 210 controls the switching operations of the DEMUX 141 and the MUX 145 based on the initial symbol and a repeating/puncturing pattern determined by the TTI. The DEMUX 141 separates the current radio frame symbols into component rate matchers input and the MUX 145 multiplexes the output symbols of the rate-matchers to a radio frame. Here, the DEMUX 141 separates an information symbol, a first parity symbol, and a second parity symbol from a radio frame stream received from the radio frame segmenter 130.

The component rate matchers 142, 143, and 144 rate match the information symbol, the first parity symbol, and the second parity symbol from the DEMUX 141, respectively, by puncturing or repetition. The component rate matcher 142 just bypasses the received information symbol without real puncturing, whereas component rate matchers 143 and 144 puncture the received parity symbols according to a preset pattern determined by the ratio of the number of input symbols to the number of output symbols. In most of the real cases, the component rate matchers 143 and 144 just bypass the received parity symbols without real repetition except heavy repetition of the encoded symbols, whereas the component rate matcher 142 repeats the received information symbols according to a preset pattern determined by the ratio of the number of input symbols to the number of output symbols. The MUX 145 multiplexes the symbols received from the component rate matchers 142, 143, and 144 to one stream according to the same switching pattern as used in the DEMUX 141.

Figure 15:
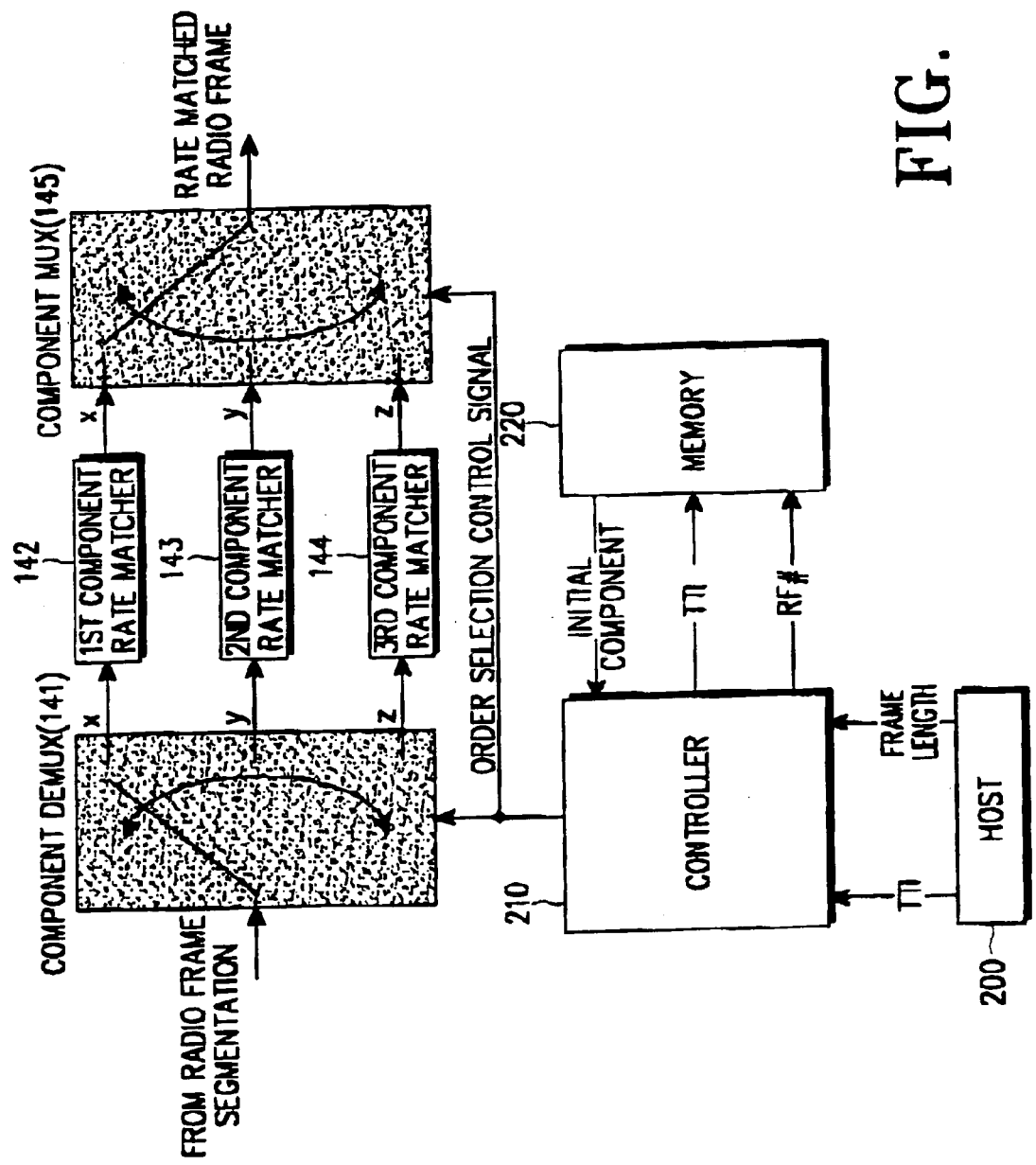
FIG. 15 is a block diagram of a DEMUX & MUX controlling apparatus according to yet another embodiment of the present invention.

FIG. 15 is a block diagram of a DEMUX and MUX controlling apparatus according to the third embodiment of the present invention.

Referring to FIG. 15, upon receipt of a TTI and a radio frame length from the host 200, the controller 210 feeds the TTI and the radio frame index of a current radio frame to memory 220 (see Table 18) and receives the initial symbol of the current radio frame from memory 220. Then, the controller 210 controls the switching operations of the DEMUX 141 and the MUX 145 based on the initial symbol and a repeating/puncturing pattern determined by the TTI. The DEMUX 141 separates the current radio frame symbols into input for the component rate matchers and the MUX 145 multiplexes the output symbols of the rate matchers to a radio frame. Here, the DEMUX 141 separates an information symbol, a first parity symbol, and a second parity symbol from a radio frame stream received from the radio frame segmenter 130. The component rate matchers 142, 143, and 144 rate match the information symbol, the first parity symbol, and the second parity symbol from the DEMUX 141, respectively, by puncturing or repetition. The component rate matcher 142 just bypasses the received information symbol without real rate puncturing, whereas component rate matchers 143 and 144 puncture or repeat the received parity symbols according to a pattern preset determined by the ratio of the number of input symbols to the number of output symbols. The MUX 145 multiplexes the symbols received from the component rate matchers 142, 143, and 145 to one stream according to the same switching pattern as used in the DEMUX 141. In most of the real cases, the component rate matchers 143 and 144 just bypass the received parity symbols without real repetition except heavy repetition of the encoded symbols, whereas the component rate matcher 142 repeats the received information symbols according to a preset pattern determined by the ratio of the number of input symbols to the number of output symbols.

As described above, the present invention is advantageous in that effective rate matching can be performed by adding a DEMUX before a rate matching unit to separate an information symbol and parity symbols of the encoded symbols when the information symbol is not to be punctured for rate matching in an uplink transmitter in a mobile communication system.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An uplink transmitting device in a mobile communication system, comprising:
    an encoder for receiving a first information bit stream and for outputting three streams, a second information bit stream, a first parity stream, and a second parity stream, by encoding the first information bit stream;
    an interleaver for interleaving the encoded streams by a predetermined interleaving rule;
    a radio frame segmenter for receiving the interleaved stream from the interleaver and mapping the received interleaved stream onto at least one consecutive radio frame;
    a demultiplexer for separating each of the at least one radio frames received from the radio frame segmenter into a third information bit stream, and first and second parity streams from the demultiplexer; and
    a rate matcher for bypassing the third information bit stream and for puncturing a part of the first and second parity streams from the demultiplexer according to a given rate matching rule.

2. The transmitting device of claim 1, wherein the interleaved stream is mapped onto consecutive radio frames when a transmission time interval (TTI) is longer than 10 ms.

3. The transmitting device of claim 1, wherein the transmission time interval (TTI) is one of 10, 20, 40, and 80 ms.

4. The transmitting device of claim 1, wherein the interleaving rule is a bit reverse method.

5. The transmitting device of claim 1, wherein an arrangement of information bits and parity bits in each of the at least one radio frames has a regular pattern.

6. The transmitting device of claim 2, wherein the consecutive radio frames have initial bits determined by the TTI.

7. The transmitting device of claim 5, wherein the demultiplexer separates bits of the radio frame into the third information bit stream, and the first and second parity streams from the demultiplexer according to the regular pattern.

8. The transmitting device of claim 7, further comprising:
    a memory for storing initial symbols of the consecutive radio frames; and
    a controller for controlling the demultiplexer according to the regular pattern and the stored initial bits of the at least one radio frames.

9. The transmitting device of claim 8, further comprising:
    a multiplexer for multiplexing the outputs of the rate matcher under a control of the controller.

10. The transmitting device of claim 1, wherein the interleaver interleaving the encoded streams at a TTI (Transmission Time Interval) after inserting filler bits into the encoded streams in order to equalize a size of the at least one radio frames.

11. The transmitting device of claim 1, wherein the rate matcher comprises:
a first component rate matcher for rate-matching the information bits;
a second component rate matcher for rate-matching the first parity bits; and
a third component rate matcher for rate-matching the second parity bits.

12. A transmitting device in a mobile communication system, comprising:
an encoder for receiving an information bit stream transmitted at a predetermined transmission time interval (TTI) and for outputting the information bit stream and at least one type of parity stream by encoding the information bit stream in accordance with a coding rate of said encoder;
an interleaver for receiving the information bit stream and the at least one type of parity stream from the encoder, for interleaving the information bit stream and the at least one type of parity stream and for outputting interleaved stream;
a radio frame segmenter for receiving the interleaved stream from the interleaver, for dividing the received stream into radio frames, and for outputting the radio frames in sequence;
a demultiplexer for receiving the radio frames and for demultiplexing the received radio frames back into the information bit stream and the at least one type of parity stream; and
a rate matcher for rate matching the streams received from the demultiplexer and outputting rate matched streams, said rate matcher having at least one component rate matcher for rate matching a part of the parity stream, a number of the at least one component rate matcher being equal to a number of the parity streams,
wherein the demultiplexer switches each of the parity bits in the radio frames to said at least one component rate matcher corresponding to each of the parity bits.

13. The transmitter device of claim 12, wherein bits of the radio frame are separated to the at least one component rate matcher corresponding to each type of parity stream in accordance with a regular pattern for arranging information bits and parity bits in each radio frame.

14. The transmitter device of claim 13, wherein the regular pattern is determined by the TTI.

15. The transmitter device of claim 14, wherein the regular pattern is further determined by the coding rate.

16. The transmitter device of claim 12, further comprising:
a multiplexer for multiplexing the rate matched streams by switching outputs of the at least one component rate matcher.

17. The transmitter device of claim 16, further comprising:
a controller for controlling the switching of the demultiplexer and the multiplexer based on at least one of the TTI and the length of each of the radio frames.

18. The transmitter device of claim 12, wherein a length of each of the radio frames is 10 ms.

19. The transmitter device of claim 12, wherein the TTI is one of 10, 20, 40 and 80 ms.

20. The transmitter device of claim 12, wherein the coding rate is ⅓.

21. The transmitter device of claim 13, further comprising a memory for storing the regular pattern including an initial symbol corresponding to each of the radio frames.

22. The transmitter device of claim 12, wherein the encoder is a turbo encoder.

23. A method of transmitting in a mobile communication system, the method comprising the steps of:
receiving an information bit stream transmitted at a predetermined transmission time interval (TTI);
encoding the information bit stream and outputting the encoded information bit stream and at least one type of parity stream corresponding to the information bit stream, a number of the parity streams corresponding to a coding rate of an encoder;
interleaving the information bit stream and the parity stream and outputting the interleaved stream;
dividing the interleaved stream into at least one radio frame and outputting the at least one radio frame, each of the at least one radio frame having a predetermined time frame;
demultiplexing the received radio frame back into the information bit stream and at least one type of parity stream; and
rate matching the demultiplexed streams by a rate matcher;
wherein parity bits in the radio frame are switched to a component rate matcher corresponding to each of the at least one parity stream, said component rate matcher having at least one parity component rate matcher for rate matching a part of said at least one parity stream, a number of the at least one parity component rate matcher being equal to a number of the at least one parity stream.

24. The method of claim 23, wherein bits of the at least one radio frame are separated to the component rate matcher by the demultiplexer in accordance with a regular pattern for arranging information bits and parity bits in each radio frame.

25. The method of claim 24, wherein the regular pattern is determined by the TTI.

26. The method of claim 25, wherein the regular pattern is further determined by the coding rate.

27. The method of claim 23, further comprising the step of:
multiplexing the rate matched streams by synchronizing the multiplexing with the demultiplexing by switching to the corresponding component rate matcher.

28. The method of claim 23, wherein the predetermined length of the radio frame is 10 ms.

29. The method of claim 23, wherein the TTI is one of 10, 20, 40 and 80 ms.

30. The method of claim 23, wherein the coding rate is ⅓.

31. A transmitting device in a mobile communication system, comprising:
an encoder for receiving an information bit stream transmitted at a predetermined transmission time interval (TTI) and for outputting the information bit stream and at least one kind of parity stream corresponding to the information bit stream in accordance with a coding rate of said encoder;
an interleaver for receiving the information bit stream and the parity stream from the encoder, for interleaving the information bit stream and the parity stream, and for outputting an interleaved stream;
a demultiplexer for receiving the interleaved stream and for demultiplexing the received interleaved stream back into the information bit stream and the at least one kind of parity stream; and
a rate matcher for rate matching the information bit stream and the at least one kind of parity stream received from the demultiplexer, wherein said rate matcher includes at least one component rate matcher for rate matching a part of the at least one kind of parity stream, and a number of the component rate matcher is equal to a number of the at least one kind of parity stream, wherein the demultiplexer switches bits in the interleaved stream to the component rate matcher corresponding to each of the at least one kind of parity stream.

32. The transmitter device of claim 31, wherein the demultiplexer switches each of the bits of the interleaved stream to the at least one component rate matcher in accordance with a regular pattern for arranging information bits and parity bits in the interleaved stream.

33. The transmitter device of claim 32, wherein the regular pattern is determined by the TTI.

34. The transmitter device of claim 32, further comprising:
a multiplexer for synchronously multiplexing output bits of the at least one component rate matcher by synchronizing with the demultiplexer.

35. The transmitter device of claim 34, further comprising:
a controller for controlling the demultiplexer and the multiplexer based on the regular pattern.

36. The transmitter device of claim 31, wherein a length of at least one of the information bit stream and the interleaved stream is 10 ms.

37. The transmitter device of claim 31, wherein the TTI is one of 10, 20, 40 and 80 ms.

38. The transmitter device of claim 31, wherein the coding rate is ⅓.

39. The transmitter device of claim 33, further comprising:
a memory for storing the regular pattern including an initial symbol corresponding to the interleaved stream.

40. The transmitter device of claim 31, wherein the encoder is a turbo encoder.

41. A method of transmitting in a mobile communication system, the method comprising the steps of:
receiving an information bit stream at a predetermined transmission time interval (TTI);
encoding the information bit stream and outputting the encoded information bit stream and at least one kind of parity stream corresponding to the information bit stream in accordance with a coding rate of a encoder;
interleaving the information bit stream and the parity stream and outputting an interleaved stream;
demultiplexing the interleaved stream back into the information bit stream and the at least one kind of parity stream; and
rate matching the demultiplexed streams by a rate matcher, said rate matcher including at least one component rate matcher for rate matching a part of said at least one kind of parity stream;
wherein bits in the interleaved stream are switched to at least one parity component rate matcher corresponding to each of the at least one kind of parity stream, a number of the at least one parity component rate matcher being equal to a number of the at least one parity stream.

42. The method of claim 41, wherein the bits of the interleaved stream are separated in accordance with a regular pattern for arranging information bits and parity bits in the interleaved stream.

43. The method of claim 42, wherein the regular pattern is determined by the TTI.

44. The method of claim 41, further comprising the step of:
multiplexing the output bits of the rate matching step by synchronizing the multiplexing with the demultiplexing by switching in the rate matcher.

45. The method of claim 41, wherein a length of at least one of the information bit stream and the interleaved stream is 10 ms.

46. The method of claim 41, wherein the TTI is one of 10, 20, 40 and 80 ms.

47. The method of claim 41, wherein the coding rate is ⅓.

48. A mobile communication system, comprising:
an encoder for receiving an information bit stream and for outputting three encoder output streams, an information bit stream, a first parity stream, and a second parity stream, by encoding the information bit stream;
an interleaver coupled to the encoder for performing an interleaving operation according to a predetermined interleaving rule;
a radio frame segmenter for receiving an interleaved stream from the interleaver and mapping the interleaved stream onto at least one radio frame;
a demultiplexer for separating the at least one radio frame received from the radio frame segmenter into three demultiplexer output streams; and
a rate matcher for bypassing an information bit stream from the demultiplexer and for puncturing a part of a first and second parity streams from the demultiplexer according to a given rate matching rule.

49. The system of claim 48, wherein the interleaved stream is mapped onto consecutive radio frames when a transmission time interval (TTI) is longer than 10 ms.

50. The system of claim 48, wherein the interleaver performs the interleaving operation at a TTI (Transmission Time Interval), after inserting filler bits into an output of the encoder, in order to equalize a size of the at least one radio frames.

51. The system of claim 48, wherein the rate matcher comprises:
a first component rate matcher for rate-matching the information bit stream from the demultiplexer;
a second component rate matcher for rate-matching the first parity stream from the demultiplexer; and
a third component rate matcher for rate-matching the second parity stream from the demultiplexer.

52. A method for transmitting data in a mobile communication system, the method comprising:
encoding an information bit stream corresponding to a coding rate of an encoder and outputting the information bit stream, a first parity stream, and a second parity stream;
performing an interleaving operation with an interleaver coupled to the encoder;
mapping an interleaved stream from the interleaver onto at least one radio frame and outputting the at least one radio frame;
performing an demultiplexing operation with a demultiplexer and outputting an information bit stream of the demultiplexer, and a first parity stream of the demultiplexer, and a second parity stream of the demultiplexer; and
bypassing the information bit stream of the demultiplexer and puncturing a part of the first and second parity stream from the demultiplexer according to a given rate matching rule.

53. The method of claim 52, wherein the interleaved stream is mapped onto consecutive radio frames when a transmission time interval (TTI) is longer than 10 ms.

54. The method of claim 52, wherein the interleaving operation is performed at a TTI (Transmission Time Interval), after inserting filler bits into an output of the encoder, in order to equalize a size of the at least one radio frame.

55. A mobile communication system, comprising:
  means for receiving an information bit stream and for outputting an output stream including an information bit stream, a first parity stream, and a second parity stream, by encoding the information bit stream;
  means for performing an interleaving operation in response to the output stream and outputting an interleaved stream;
  means for creating at least one radio frame in response to the interleaved stream;
  means for separating the at least one radio frame into a separate information bit stream, a first separate parity stream, and a second separate parity stream; and
  means for bypassing the separate information bit stream and for puncturing a part of the first and second separate parity streams according to a given rate matching rule.

56. The system of claim 55, wherein the interleaved stream is mapped onto consecutive radio frames when a transmission time interval (TTI) is longer than 10 ms.

57. The system of claim 55, wherein the interleaving operation is performed at a TTI (Transmission Time Interval), after inserting filler bits into the output stream, in order to equalize a size of the at least one radio frame.

* * * * *